(12) United States Patent
Tumer et al.

(10) Patent No.: US 8,120,683 B1
(45) Date of Patent: Feb. 21, 2012

(54) HIGH RESOULTION DIGITAL IMAGING APPARATUS

(75) Inventors: Tumay O Tumer, Riverside, CA (US); Shi Yin, Riverside, CA (US); Dale G. Maeding, Dana Point, CA (US); James Asbrock, Oceanside, CA (US); Martin Yaffe, Toronto (CA); Gordon Mawdsley, Toronto (CA); James Mainprize, North York (CA)

(73) Assignee: Nova R & D, Inc., Riverside, CA (US)

( * ) Notice: Subject to any disclaimer, the term of this patent is extended or adjusted under 35 U.S.C. 154(b) by 0 days.

(21) Appl. No.: 09/544,561

(22) Filed: Apr. 6, 2000

Related U.S. Application Data

(60) Provisional application No. 60/128,407, filed on Apr. 8, 1999.

(51) Int. Cl.
*H04N 3/14* (2006.01)
*H01L 27/146* (2006.01)

(52) U.S. Cl. .................................... 348/295; 250/370.09

(58) Field of Classification Search ................... 348/295; 250/370.09
See application file for complete search history.

(56) References Cited

U.S. PATENT DOCUMENTS

| | | | | |
|---|---|---|---|---|
| 4,280,141 A * | 7/1981 | McCann et al. | ............... | 348/295 |
| 4,609,823 A * | 9/1986 | Berger et al. | ............. | 250/370.09 |
| 4,695,889 A * | 9/1987 | Portmann | ..................... | 348/311 |
| 4,779,005 A * | 10/1988 | Arnold | ........................... | 348/295 |
| 4,905,265 A | 2/1990 | Cox et al. | | |
| 5,149,954 A * | 9/1992 | Pettijohn et al. | ........... | 250/208.1 |
| 5,379,336 A | 1/1995 | Kramer et al. | | |
| 5,396,072 A * | 3/1995 | Schiebel et al. | ......... | 250/370.09 |
| 5,448,161 A * | 9/1995 | Byerley et al. | .................. | 324/72 |
| 5,629,524 A * | 5/1997 | Stettner et al. | ........... | 250/370.09 |
| 5,652,150 A * | 7/1997 | Wadsworth et al. | ............ | 438/60 |
| 5,834,782 A * | 11/1998 | Schick et al. | ............. | 250/370.11 |
| 5,886,353 A * | 3/1999 | Spivey et al. | ............. | 250/370.09 |
| 5,898,332 A * | 4/1999 | Lefevre | .......................... | 327/337 |
| 5,943,388 A * | 8/1999 | Tumer | .......................... | 378/98.9 |
| 5,978,101 A * | 11/1999 | Hofmann et al. | .......... | 250/208.1 |
| 6,118,853 A * | 9/2000 | Hansen et al. | ................ | 378/143 |
| 6,172,369 B1 * | 1/2001 | Waechter et al. | ........ | 250/370.09 |
| 6,255,708 B1 * | 7/2001 | Sudharsanan et al. | ........ | 257/428 |
| 6,445,767 B1 * | 9/2002 | Karellas | ................... | 250/370.09 |
| 6,504,574 B1 * | 1/2003 | Noguchi et al. | .............. | 348/295 |

OTHER PUBLICATIONS

Henry, J.M. et al., "Solid State High Resolution Detectors for Digital Mammography," *Physics of Medical Imaging* (Presented at COMP, Toronto Canada, Sep. 1994) Aug. 1994, Abstract, vol. 21, No. 8.

Henry, Justin et al., "Solid State X-Ray Detectors for Digital Mammography," *Physics of Medical Imaging* (Presented at SPIE—The International Society for Optical Engineering), Feb. 1995, pp. 392-401, vol. 2432.

(Continued)

*Primary Examiner* — Nhan T Tran
(74) *Attorney, Agent, or Firm* — Fish & Associates, PC

(57) ABSTRACT

An integrated application specific integrated circuit having a detection layer, a time delayed integration capability, data acquisition electronics, and a readout function is provided for detecting breast cancer in women. The detection layer receives x-ray radiation and converts the received energy to electron pairs, one of which is received by pixels. The time delay integration is on the chip and a part of the readout architecture. The detector may be a hybrid silicon detector (SiPD), a CdZnTe detector, or a GaAs detector.

57 Claims, 14 Drawing Sheets

OTHER PUBLICATIONS

CEA Technologies Avancees, "New Detectors for X-ray or γ-Ray Imaging," Sep. 1995, Grenoble, France.

Henry, Justin et al., "Noise in Hybrid Photodiode Array—CCD X-Ray Image Detectors for Digital Mammography,"*Physics of Medical Imaging* (Presented at SPIE—The International Society for Opitical Engineering) Feb. 1996, pp. 106-115, vol. 2708.

Ford, Nancy et al., "A Prototype Photodiode/CDD X-Ray Detector For Mammography," *Physics of Medical Imaging* (Presented at COMP, London, Canada) Jun. 1998, vol. 25, No. 6.

Mainprize, J.G. et al., "Design and Optimization of a Direct Conversion Detector for Digital Mammography," *Physics of Medical Imaging* (Presented at COMP, London, Canada) Jun. 1998, vol. 25, No.6.

Mainprize, James et al., "Design Considerations for a CDZNTE Digital Mammography System,"Presented at the International Workshop on Digital mammography, Nijmegen, Netherlands) Jun. 1998.

Yin, Shi et al., "A Low-Dose High Contrast Digital mammography System (DigiMAM)," Presented at IEEE meting, Toronto, Canada, Nov. 1998.

Mainprize, James et al., "Image Quality of a Prototype Direct Conversion Detector for Digital Mammography," *Physics of Medical Imaging* (Presented at SPIE—The International Society for Optical Engineering) Feb. 1999, pp. 398-406, vol. 3659.

Mainprize J.G. et al., "Image Quality of a Slot-Scanned Photodiode/ CCD Hybrid Detector for Digital Mammography," *Physics of Medical Imaging* (Presented at COMP London, Canada Jun. 1999) Jul. 1999, vol. 26, No. 7.

Yin, Shi et al., "Hybrid Direct Conversion Detectors for Digital Mammography," Presented at IEEE Nuclear Science Symposium in 1998 Published Dec. 1999.

\* cited by examiner

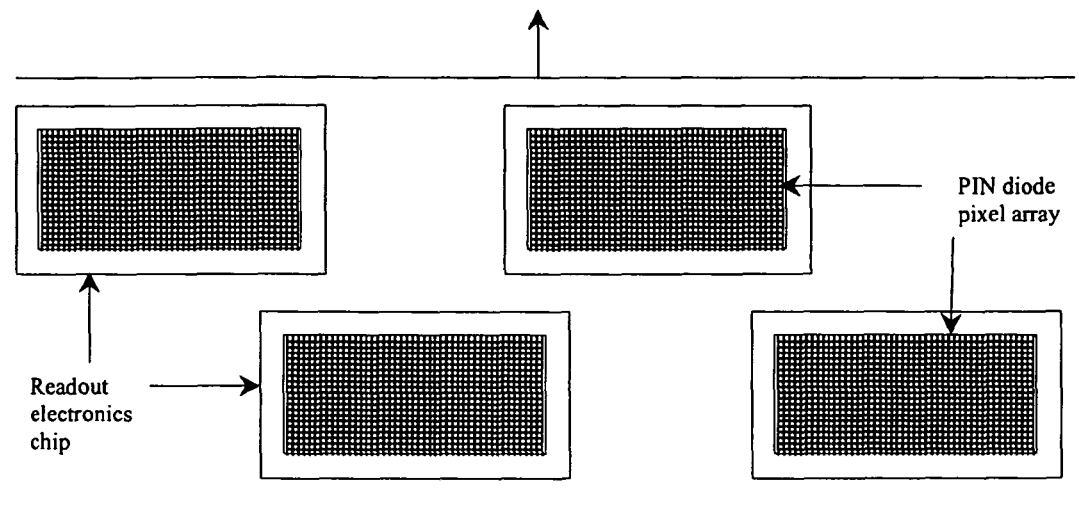
FIG. 1a: Staggered pixel detector linear array.
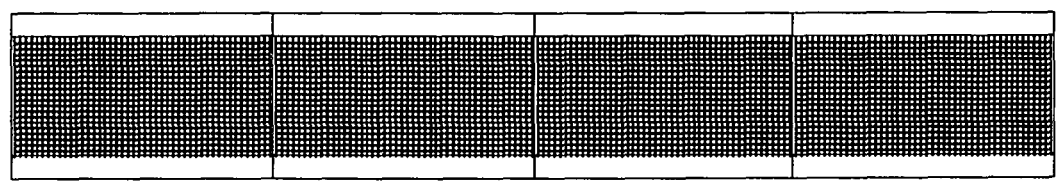
FIG. 1b: Abutted pixel detector linear array.
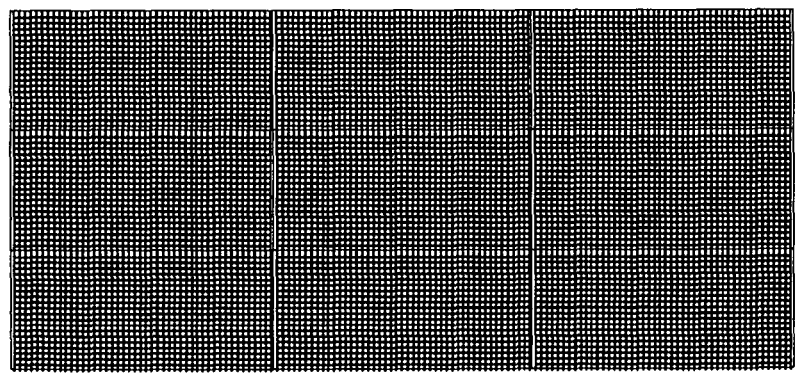
FIG. 1c: Abutted pixel detector two dimensional array.

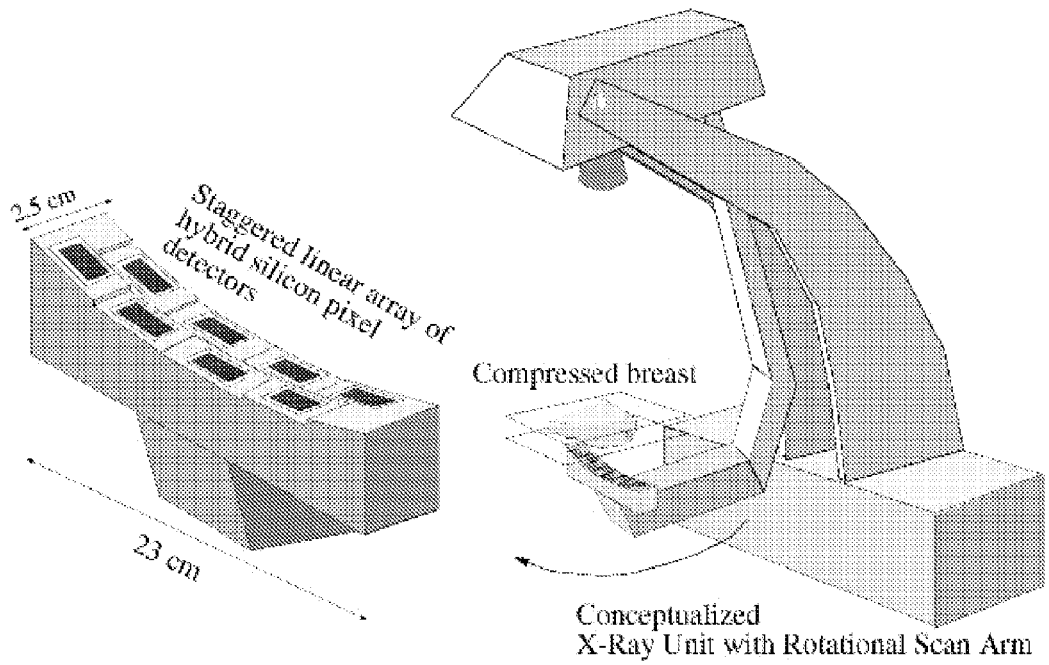
Fig. 2a                                    Fig. 2b
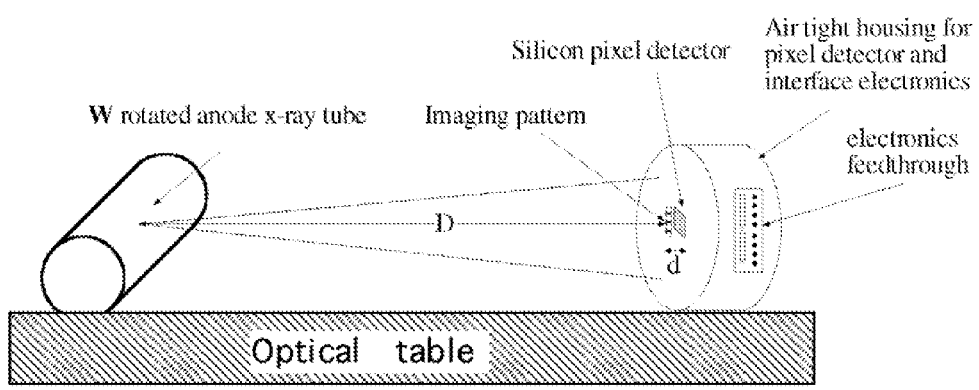
D: distance between x-ray source and silicon pixel detector.
d: distance between imaging pattern and silicon pixel detector.
Fig. 4

HIGH RESOULTION DIGITAL IMAGING APPARATUS

CROSS REFERENCE TO PROVISIONAL PATENT APPLICATION

This application claims the benefit of the filing date of U.S. Provisional Patent Application 60/128,407 filed Apr. 8, 1999, the disclosure of which is incorporated herein by reference.

GOVERNMENT RIGHTS NOTICE

This invention was made with U.S. Government support under Contract Numbers DAMD17-97-1-7255, 1R43CA61420-03, and CA66015 awarded by the Department of Defense, National Institute of Health and National Cancer Institute, and the National Institute of Health, respectively. The U.S. Government has certain rights in this invention.

FIELD OF THE INVENTION

Mammography has attained widespread acceptance as an important tool for the screening and early diagnosis of breast cancer. Current mammography systems are screen-film based and have limited x ray detection efficiency and limited ability to display fine details. The x-ray film also needs to be photographically developed before it can be viewed, which introduces extra complications, delays and errors. Pixel detectors which absorb x-rays directly have highly desirable properties for digital mammography and are used with this invention.

Each year in the U.S. approximately 180,000 women are diagnosed with breast cancer and 46,000 women die. In all, 10 to 11% of all women can expect to be affected by breast cancer at some time during their lives. The causes of breast cancer are not yet understood. Screening and early diagnosis are currently the most effective ways to reduce mortality from this disease.

THE PRIOR ART

At present film based x-ray mammography systems are widely used for screening suspected breast cancers. These can be effective instruments for early detection of breast cancer. The screen-film systems remain largely unchallenged as the standard in mammography.

The x-ray source is typically from a molybdenum (Mo) target and a Mo filter operated at 25 to 29 kV peak voltage. The x-ray spectrum consists of significant amount of energy from the characteristic lines of Mo (17.37, 17.48 and 19.61 keV). The spectrum hardens significantly after the x-ray beam crosses the breast because the tissue absorbs the lower energy photons more readily. The average energy of the x-ray photons incident on the screen-film sensor becomes about 20 keV. This low x-ray energy is imperative for generating visible x-ray contrasts from the extremely low density differences within the breast. The breast is an organ of little inherent radiological contrast, consisting of fat, soft parenchymal tissues, and small calcifications. Adequate visualization of the breast anatomy and pathologic conditions requires that a mammogram have much higher quality than radiographs used for other clinical purposes.

There are three goals in mammography image quality. These are a) high detail, b) low noise and c) high contrast. These goals are usually counter to the requirement for low patient dose. A compromise must be made to produce adequate image quality with the least possible radiation to the breast tissue. There are several technical factors that limit the ability of screen-film mammography systems to display the finest or most subtle details of the breast features. These factors include:

1. Non-linear film characteristics: Necessitates a compromise between display contrast and system latitude.
2. Limited dynamic range: The limited dynamic range of film, about 40:1, limits contrast sensitivity. For a 6.5 cm compressed glandular breast, the imaging system must record and display information which varies over a factor of 400 for a single image.
3. Film noise: Film granularity limits the deductibility of small features, such as microcalcifications.
4. Image processing: Image processing at present requires digitization of film mammograms. The digitization process introduces digitization noise to the images and its success depends significantly on the quality of the original film. Digital mammography systems that can acquire data directly into computer are superior to the film based systems.

BRIEF SUMMARY OF THE INVENTION

The proposed digital mammography sensor system is designed and fabricated as follows:

The hybrid silicon pixel detector (SiPD) is fabricated from two sections which are a two-dimensional silicon PIN diode array and a front end readout electronics chip with time delayed integration (TDI) based upon a charge coupled device (CCD) type read out. Both sections are designed to have matching pixel geometry and the two sections are electrically connected together using an indium bump bonding technique. This allows each diode to be directly connected to its readout electronics and allows fabrication of small capacitance and low noise detectors. The active detector section of the PIN diode array, can be made with no dead volume and with larger thickness to increase quantum efficiency. The diode array detects x rays directly without a scintillator or fluorescent screen. The diode may be fabricated with 44×44 micron$^2$ pixels and 1.5 mm to 2 mm thickness. When higher resistivity silicon substrates are available, the thickness of the PIN diode array can be increased to 2 mm to further improve the quantum efficiency. Also smaller pixel sizes ($\geqq 30$ micron) can be used to improve resolution if needed. The silicon PIN diode array and the readout electronics chip can be fabricated using Orbit's 2.0 micron CMOS CCD process. This is a well developed low noise process with good resistance to radiation.

The scanning digital mammography system uses a hybrid pixel detector system. A scanning linear detector array is mounted on an accurate swing arm and the array can be scanned sideways under the patient's breast. Sideways scanning is preferred as it allows the linear array to achieve uniform speed before starting to image and slow down only after the imaging is finished. It also allows coming close to the chest wall not to miss any breast tissue.

The scanning linear array detector system is read out using the time delayed integration (TDI) based on a CCD type readout. Standard TDI circuitry is designed and built using a CMOS CCD process. This reduces the complexity of the scanned imaging system. The TDI technique brings an important advantage to the proposed system since it greatly reduces the required data bandwidth, and it is also intrinsically immune to a small fraction of imperfect pixels. This increases the yield and decreases the cost. However, the sensors still must be well calibrated to allow for the non functioning pixels. The width of the hybrid chip is made from about 128 pixels (approximately 0.6 cm) to reduce x-ray tube loading and the length 512 pixels (approximately 2.2 cm) to minimize the depth (curvature) effect. The TDI is applied over the 128 pixels.

The readout chip is normally larger than the diode array to accommodate the additional circuitry necessary for pixel readout. The diode array also may have inefficient pixels at the edges. Therefore, the abutment of the hybrid pixel detectors is not a standard process and also not necessary. The pixel detectors are arranged in a staggered linear array formation such that there will be two staggered linear arrays aligned to each other which completely cover the full field-of-view without gaps and with or without overlap when moved normal to the array formation. The sideways scanning system is important in such a case to cover the full breast down to the chest wall. Ten pixel detectors may be used, 10 on each staggered linear array to cover a width of about 20 cm, see FIGS. 1, 2(a) and 2(b). The signal output from the back array is delayed in time from the front array for a fraction of a second so that the two images are corrected with respect to time and one complete image is produced by the host computer at the end of the scan period. The scan length is planned to be about 30 cm and the scan time about 4 seconds. The final image produced is about 5,200 by 6,800 pixels. The linear array inherently has low scattered photon background which is an asset. Therefore, there may not be a need for a grid. Most of the photons scattered in the breast tissue will miss the thin linear array.

The radius of curvature of x-ray radiation is about 70 cm. This means that at the two ends of an 20 cm long linear array, the photon interaction width is about 0.2 mm for a 1.5 mm thick silicon diode array. This is larger than the 44 micron pixel size. Therefore, the pixel detectors must be placed on a curved platform with radius of about 70 cm (FIG. 2(a). This will reduce the depth effect to 20 micron for 2.2 cm long pixel detector which is smaller than the proposed pixel size. The range of the photoelectron produced from a 20 kev photon in silicon is about 2.5 micron in the normal direction to the photon path. The electron-hole (e-h) pairs produced by the photoelectron move directly to the nearest pixel in opposite directions under the influence of the applied bias voltage and do not diffuse out to other pixels. Therefore, a 1.5 mm active volume thickness should not affect significantly the spatial resolution.

Federal regulations require that only the part of the breast covered by an active sensor element must receive radiation. This requires the design and fabrication of a collimator which will directly match the active sensor areas of the staggered linear array.

The SiPDs are technologically ready to manufacture as a commercial sensor. The diode arrays with 1.5 mm thickness are readily available. The indium bump technology is readily available.

A digital readout chip for an x-ray imaging apparatus comprises in combination: a PIN diode pixel array for converting incident x-ray energy into electrical signals, and conductive bumps for bonding pixels of the PIN diode array to a readout integrated circuit; wherein the readout chip provides time delay integration which passes the electrical signal from one pixel to its neighbor in a scan direction.

A digital readout chip for an x-ray imaging apparatus comprises in combination: a PIN diode pixel array for converting incident x-ray energy into electron hole pairs, and conductive bumps for bonding pixels of the PIN diode array to a readout integrated circuit; wherein the PIN diode pixel array is a GaAs PIN pixel detector.

The invention described comprises an imaging detector with plurality of readout channels coupled to a plurality of detector pixels for providing a plurality of readout signals at an output. Wherein each said readout channel comprises a detector for receiving one or more detector pixel signals from at least one of the plurality of detector pixels by said corresponding plurality of readout channels, a means for transferring stored charge produced in the detector pixels to corresponding readout channels and a means for outputting integrated charge from each channel to at least one output. The plurality of readout channels and plurality of detector pixels of the imaging detector are formed in one- or two-dimensions. The imaging detector uses a clock signal to move charge from one readout channel to an adjacent readout channel, which is synchronized to motion of the detector pixels with respect to an imaged object. The imaging detector wherein sizes and dimensions of readout channels and pixels match each other. The imaging detector can also be used to image an object using a particle or a light source wherein the light source frequency can extend from infrared to ultra violet. The imaging detector, wherein imaging detector sides abut which provide for uniform one- or two-dimensional arrays which are formed to produce continuous uncut images.

The invention in another embodiment describes an imaging detector array wherein each imaging detector comprises a plurality of readout channels coupled to a plurality of detector pixels for providing a plurality of readout signals to an output. Wherein each readout channel of said plurality of readout channels comprises a detector for receiving one or more detector pixel signals from at least one of said plurality of detector pixels by said corresponding plurality of readout channels, a means for transferring stored charge produced in the detector pixels to corresponding readout channels, and a means for outputting integrated charge from each channel to at least one output. The plurality of readout channels and plurality of detector pixels of the imaging detector array are formed in one- or two-dimensions. The imaging detector array can also be used to image an object using a particle or a light source wherein the light source frequency can extend from infrared to ultra violet. The imaging detector array uses a clock signal which moves charge from one readout channel to an adjacent readout channel which is synchronized to the motion of the detector pixels with respect to an imaged object. The imaging detector array, wherein sizes and dimensions of readout channels and pixels match each other. The imaging detector array, wherein imaging detector sides abut which provide for uniform one- or two-dimensional arrays which are formed to produce continuous uncut images.

The invention further describes another embodiment where a scanning digital photon imaging system is described. The scanning photon imaging system comprises subgroups of at least one source of photons, a hybrid semiconductor pixel array positioned to receive and convert photons from said source into electrical signals, wherein said hybrid semiconductor pixel array is comprised of a plurality of detector pixels individually connected to a readout chip with a corresponding plurality of readout chip channels, wherein the readout chip channels integrate charge produced in the detector pixels, and a processor to receive and convert said electrical signals into an image.

BRIEF DESCRIPTION OF THE DRAWINGS

FIG. 1 shows a staggered linear array system for gapless digital mammography imaging using the hybrid SiPDs.

FIG. 2(a) shows a layout scheme for fabricating a full size uniform digital mammography system without gaps using an array of smaller size pixel detectors.

FIG. 2(b) shows an x-ray unit with a rotational arm for holding and scanning with an array of detectors.

FIG. 4 shows an apparatus used to study the x-ray imaging capability of the SiPDs for application to digital mammography.

FIG. 5(a) is the raw image received straight from the detector without enhancement, and FIG. 5(b) is the filtered image.

FIG. 6(a) shows the raw image received straight from the detector without enhancement, and FIG. 6(b) is the filtered image. The highest spatial resolution, 14 lp/mm, near the central disk is clearly discernible.

FIG. 10(b) is a gate modulation (fill and spill) circuit.

FIG. 16(a) shows an x-ray image of a 5 lp/mm bar phantom. FIG. 16(b) shows a plot of CTF versus spatial frequency.

DETAILED DESCRIPTION OF THE INVENTION

Advantages of the Invention

Figure 3A:
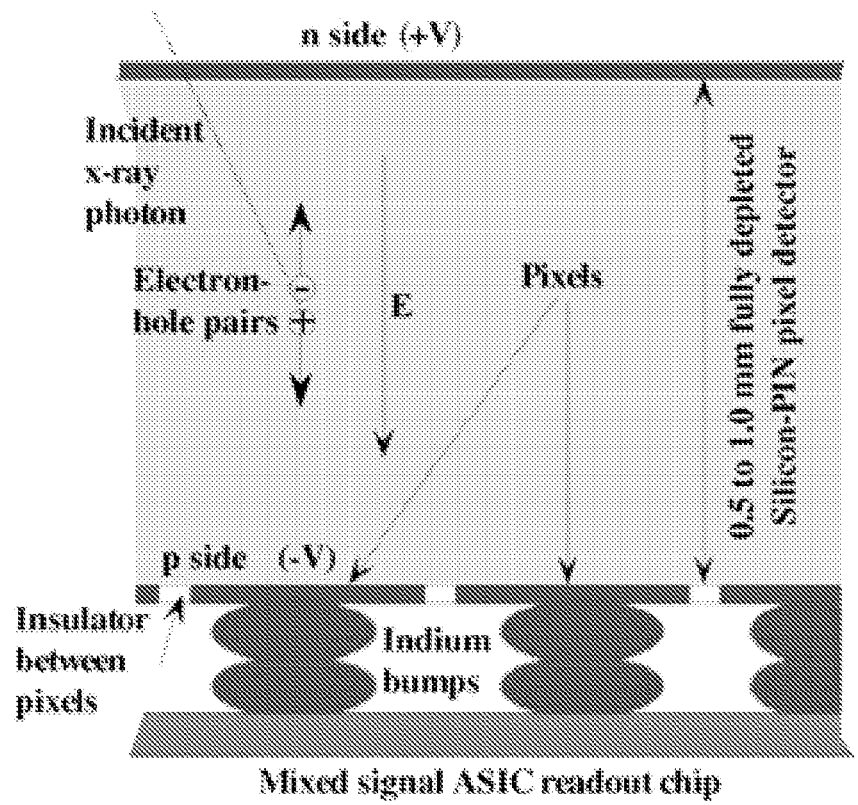
FIG. 3(a) shows the operation principle of a silicon-PIN reverse-biased pixel detector indium bump bonded onto the ASIC readout chip.

The SiPDs have excellent properties which can lower the radiation dose, improve resolution and overcome the limitations of the present mammography systems. The digital mammography system of this invention using SiPDs provides the following advantages:

1. High spatial resolution: A silicon pixel detector with pixel size of 44×44 micron$^2$ or 50×50 micron$^2$ is conservatively planned for the proposed prototype. Smaller pixel sizes to 25×25 micron$^2$ with TDI capability may be feasible if necessary. This will allow high resolution fine detail imaging.

2. Low-dose rate: The interaction probability of SiPDs can be reasonably high because the depletion region can be made thick. The proposed SiPDs have excellent photo-absorption efficiency for 15 to 25 kev x rays. The present technology can produce 1.5 mm thick pixel detectors, which give about 95%, 78% and 53% quantum efficiencies for x-ray energies of 15, 20 and 25 keV. Larger thickness pixel detectors which will improve conversion efficiency (99%, 87% and 64% for 2 mm thick silicon, at the above energies) are feasible in the future. Unlike screen-film systems the increase in the pixel detector thickness does not affect the resolution of the proposed digital mammography system. This is because the bias voltage applied to the detector directs the electrons and holes produced into a column and the directional isotropy of the secondary electrons produced by the photoelectron is eliminated. The screen efficiency is about 60% at present for standard systems. Therefore, the high detection efficiency of the invention can be used to reduce patient dose, or a finer spatial resolution system can be developed for the same dose rate.

3. Modulation transfer function (MTF): The MTF of the SiPD has been measured. It reaches 16 cycles per mm at 16% modulation for 30×30 micron$^2$ pixel size (approximately 12 lines per mm for 44×44 micron$^2$ pixel size). The 44×44 micron pixel size is about a factor of 2 better than conventional non-mammographic film-screen systems. Furthermore, the display of fine detail is superior due to improved SNR and the possibility of digital contrast enhancement.

4. Detective quantum efficiency (DQE): The DQE of the proposed SiPD has been calculated. It has an excellent flat response nearly equal to the quantum efficiency and about a factor of 4 better than that of conventional film-screen systems at low spatial frequencies reaching to a factor of more than 10 higher at $\geq$10 cycles/mm. It also reaches up to the MTF drop off without significant loss.

5. Wide linear dynamic range: The dynamic range of the SiPDs is designed to be $\geq$10,000. A 12 bit digitizer can give a dynamic range of 4,096. The dynamic range is also linear. The wide dynamic range is expected to improve image contrast. This should be particularly valuable in women with dense breast. The proposed SiPDs eliminate the problem of compromise between display contrast and system latitude inherent in screen-film systems.

6. Negligible x-ray fluorescence effect: One problem that exists in some detector materials when x rays are absorbed by the photoelectric process is the emission of K shell x-ray fluorescence. If some of the fluorescence escapes, there is a loss of efficiency and an increase in statistical noise in the image. If, on the other hand the fluorescent x rays are re-absorbed elsewhere in the detector, there is a loss of contrast (MTF). A desirable property of silicon is that the probability of K shell fluorescence is low and the energy of fluorescence, if it occurs, is so low (approximately 1.8 keV) that re-absorption is highly localized. Therefore, loss or distant re-absorption of fluorescence is not a problem.
7. Uniform response: The detectors have square pixels and do not have dead regions in between. This produces a uniform sensitive area without distortions or artifacts.
8. Time delayed Integration (TDI): The TDI technique is applied to the scanning digital mammography. This technique tolerates random dead pixels that may happen before and/or after the fabrication. However, accurate calibration has to be performed in regular intervals to compensate for any possible changes.
9. Fast imaging capability: The digital mammography system eliminates x-ray film and post examination film development delays by producing an instantaneous image. It assists biopsy of correct tissue segments and during surgery it can be used to quickly verify that all the cancerous tissue has been removed without film development delays.
10. Computer based data acquisition: The results of an examination can be displayed instantaneously and also stored on computer media such as magnetic hard disk, optical disk or digital tape. Image processing and enhancement techniques can be used to aid the diagnosis. Direct image subtraction or comparison with previous examination can improve the accuracy of the assessment. The patient's mammograms can be accessed remotely through computer networks. This provides straight forward medical consultations between professionals at different medical institutions.
11. Mass production capability: The SiPDs have excellent potential for mass production if a strong demand is seen for these sensors in the mammography market. The mass production of these devices will bring the cost down significantly. The price may reach to present levels in the future. Therefore, excellent value-to-cost ratio can be achieved which will enable wide deployment and provide high quality diagnostic patient care and early detection capability.
12. High radiation damage resistance: The silicon PIN diode arrays inherently have high resistance to radiation damage. The readout chip can be manufactured using a radiation hard process which means long life for the proposed digital mammography system.
13. Scanning mammography system: The hybrid silicon pixel detectors are developed to be mounted on an accurate swing arm and used on a scanning type mammography system.
14. Scattered photon background discrimination: The linear array system should not normally need a scatter grid as most of the scattered photons will miss the array. This can save about a factor of 2.5 in patient dose required if scatter grid is not used. Since the array width is not negligible some basic grid system may be incorporated to improve image quality further if necessary.

The major advantages of the SiPDs for digital mammography given above show their potential. A fully functional hybrid SiPD has been developed and manufactured that has on chip TDI functionality for direct application to a scanning type digital mammography system. The prototype sensors can be mounted on a staggered linear array to carry out tests.

Prototype SiPDs have been designed and fabricated that can be used to manufacture a sensitive, high resolution scanning digital mammography system. A digital mammography system can have the following specifications:
1. Pixel size: 44×44 micron$^2$ and/or 50×50 micron$^2$.
2. Quantum efficiency: For 15, 20 and 25 keV photons the detection efficiencies are 95%, 78% and 53% for 1.5 mm thick silicon pixel detectors, respectively. Larger thickness (up to 2 mm) or higher Z pixel array detectors such as CdTe, CdZnTe and GaAs are feasible which can improve quantum efficiency further.
3. Dose: A factor of $\geqq 3$ lower patient dose can be achieved with better image quality because of improved detective quantum efficiency (DQE).
4. Dynamic range: >10,000 (approximately 16,384 (14 bits) for this project).
5. Linear response: Throughout the dynamic range.
6. Active area: $\geqq 0.64$ cm×20 cm linear array for scanning up to 20 to 30 cm length to cover a full breast. The size of the scan area is adjustable.
7. Scan time: $\leqq 4$ seconds
8. Operation temperature: Room temperature design may be used. If needed the temperature can be lowered electronically to approximately 5° C. with Peltier devices to reduce the sensor dark current.
9. Size and weight: A curved staggered linear array with radius of about 70 cm to eliminate gaps and the depth effect may be used. The array is light weight.

The proposed digital mammography system can also be used for tomographic animal studies, bone densitometry and panoramic dental x rays. The SiPD can be applied with modification to nondestructive evaluation and inspection of materials, and detection of plastic explosives and drugs. It can also be used to build high resolution x-ray detectors for astronomical observations of celestial sources. The SiPDs can be optimized for optical photon detection, which can provide excellent optical imaging sensors with high efficiency throughout the visible spectrum and infrared. Imaging UV sensors may also be developed.

The detector consists of a two-dimensional integrated array of silicon PIN diodes of 30×30 micron$^2$ pixels arranged in 256 rows by 256 columns. The thickness of the active silicon substrate was 300 microns.

Extensive hardware design and development work was done to build several interface electronics boards for the prototype SiPD. A detector support structure (housing) was designed and built with a temperature controlled electronic (Peltier) cooler to keep detector in constant temperature. The humidity inside the detector housing was kept at nearly 0%. This was achieved by using dry air or nitrogen gas.

Two prototype SiPDs were studied for x-ray imaging application. First a 70 keV x-ray source was used to debug the test data acquisition system. The energy of this source was too high to carry out useful mammography study. Therefore, the developed system was tested again using a 35 kVp rotating tungsten anode x-ray tube as the x-ray source. The average energy of the x-ray photon was approximately 20 keV. Detector spatial resolution was measured using standard bar patterns and the MTF of the detector was measured with the slanted edge step function response method. The MTF of 16 lp/mm was easily demonstrated. The MTF of the detector is about 0.16 at 16 lp/mm frequency.

X-Ray detection by SiPDs

The SiPD operates as a two-dimensional array of PIN diodes on a monolithic substrate. X-ray photons in the mammographic energy range interact with the silicon primarily through the photoelectric absorption process (95% of interactions at 20 keV). The emitted photoelectron carries most of the energy of the incident photon and loses energy locally (mean free path <5 micron) by creating electron-hole (e-h) pairs in silicon—one pair for each 3.6 eV deposited. A 20 keV x-ray photon yields approximately 5,500 e-h pairs. The PIN diode is reverse biased with sufficient externally-applied potential to fully deplete the active region from free charges. It is possible to construct arrays of such PIN diodes with negligible dead area between elements and with very low noise and low capacitance. Elements as small as 10 micron on a side can be produced. If TDI technique is applied the minimum pixel size increases to about 30 micron.

Figure 3B:
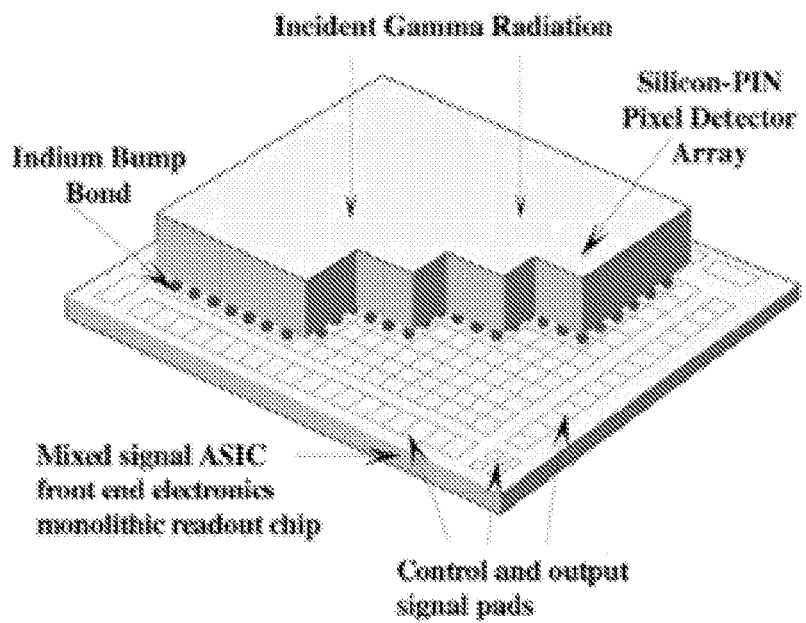
FIG. 3(b) shows a three-dimensional drawing of the silicon-PIN pixel detector of FIG. 3(a).

The electrons and holes are separated by the electrical field as shown in FIGS. 3(a) and 3(b) and collected in a few nanoseconds to produce the required signal. For pixel detectors, electrons or holes can be collected. Holes will be used in this disclosure. With adequate collecting potential, the lateral spread of the created charges can be kept at a sufficiently low level so as not to degrade spatial resolution. This allows the detector to be made sufficiently thick to achieve high quantum efficiency. K shell florescence effects should not pause a problem with the silicon detector.

The Silicon Pixel Detectors (SiPDs)

The SiPDs are made of two separate components: the two-dimensional silicon PIN diode pixel array and the two-dimensional front end readout electronics mixed signal ASIC chip. Both parts are designed to have the same pixel geometry and size so that they can be joined into a hybrid detector FIGS. 3(a) and 3(b). During hybridization the two sections are electrically connected together through indium bumps. Therefore, each PIN diode (a single pixel) makes direct contact with low resistance to the input of the readout electronics underneath. The hybrid detector is then mounted on a ceramic chip carrier or platform. The connection to outside is made through ultrasonic bonding between the readout and control pads on SiPD and the carrier.

The Application Specific Integrated Circuit (ASIC) can be manufactured using Orbit's 2 micron low noise CMOS processes. Silicon pixel detectors have large areas, excellent energy and position resolution and fast parallel readout capability.

A hybrid SiPD with 256×256 array of 30×30 $micron^2$ pixel size was developed for visual wavelength application (without TDI capability). The depletion thickness of the active volume was 300 micron. They can be used to detect x rays with good spatial and energy resolutions.

FIGS. 3(a) and 3(b) show the operation principle of the Silicon PIN reverse-biased pixel arrays. The e-h pairs are created by the photoelectron separate and drift in the opposite directions with respect to the electric field. FIG. 3(b) shows a schematic diagram of the Silicon PIN pixel detector. A two-dimensional PIN diode array is indium bump bonded onto the ASIC readout chip with the pixellated surface of the diode array facing the monolithic silicon readout chip.

SiPD Example

The front end readout electronics for these detectors was designed for a visible imaging application and did not have TDI capability. The readout system required a two phase clock for scanning in both x and y directions. Four channels were sent out simultaneously with each scanning step. All the scanner and amplifier bias voltages were supplied from an external source.

A custom electronics interface system was designed and built to test the SiPDs. The output was connected to a personal computer (PC) based data acquisition system to acquire, analyze and record the data. The resultant images are displayed on the monitor and printed out.

The SiPD interface electronics was built to fit into a 3U VME rack. It includes one detector bias voltage supply module, one amplifier and scanner bias supply unit, two scanning signal level shifter modules, and one four channel sample/hold board. Also a four channel buffer amplifier board is built and mounted close to the SiPD to minimize noise.

All the clock signals for the x-y scanners and the sample/hold clock were produced by a word generator. The clock signals were shifted to proper logic levels by the two level shift boards, and then sent to SiPD. The analog outputs of a SiPD are sampled by a sample/hold board, digitized by an ADC module placed inside the host PC computer and stored.

Since SiPD detector was made originally for visible imaging application, the maximum dynamic range of the amplifier was designed to be 200,000 electrons (about 36 x-ray photons). In order to prevent the dark current fill up of the dynamic range of the amplifier, a moderate cooling is required to use this detector for x-ray application. A Peltier cooler was used to keep the detector at −10° C. temperature. A thermistor mounted on the back of the SiPD monitored the temperature of the detector, and a temperature controller module adjusted the power to the electronic cooler to keep the temperature at a preset value.

The cooling of the SiPD required dry atmosphere environment during testing. This is achieved by designing and building an aluminum housing with excellent pressure resistant sealing (approximately 0.625 cm wall thickness). It was flushed continuously with nitrogen gas or dry air to eliminate water vapor condensation on the SiPD. The aluminum housing was also an excellent shield for electromagnetic radiation pick up. Both the SiPD and the four channel buffer amplifier board were placed inside the aluminum housing. The connection to the outside was made through special sealed connectors placed on one side of the housing. The SiPD was mounted just underneath a see through thin window on top of the housing. An x-ray beam is directed onto the SiPD through this window.

X-Ray Imaging

A 70 kV peak x-ray source was used at first. These tests were used to debug the custom made electronics and understand the functionality of the SiPD.

The images were taken with the setup configuration shown in FIG. 4, where the distance between x-ray source and detector (D) was 106 cm and the distance between imaged phantom and the detector (d) was 1 cm. The x-ray source used in this study was from a rotating tungsten anode x-ray tube, set at 35 kV peak voltage. The average energy of the x-ray output was approximately 20 keV.

Because of the limited dynamic range of the amplifier, each x-ray image was formed by integrating 10 frames of short exposures. By doing so, the x-ray exposure dynamic range of the amplifier was increased by a factor of ten. However, the noise from the electronics was also increased. Therefore, large dynamic range (well depth) is important for application to x-ray imaging. The well depth is significantly enhanced during the design of the integrated ASIC chip as discussed below.

FIG. 4 shows a setup used to study the x-ray imaging capability of the SiPDs for application to digital mammography.

Figure 5A:
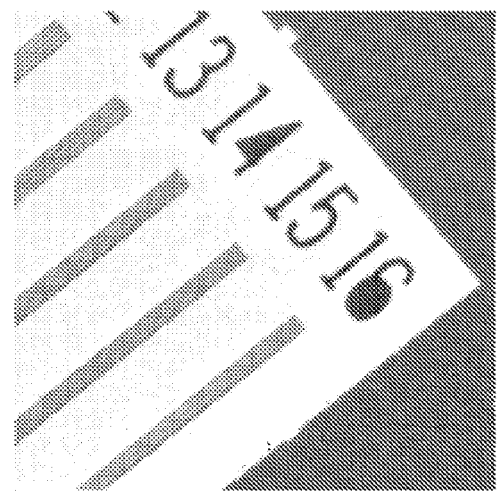
FIGS. 5(a) and 5(b) show images of copper strip patterns deposited on film. The density of the pattern starts from 16 lines per millimeter (lp/mm) (bottom cluster) and decreases with 1 lp/mm moving towards the top.
Figure 5B:
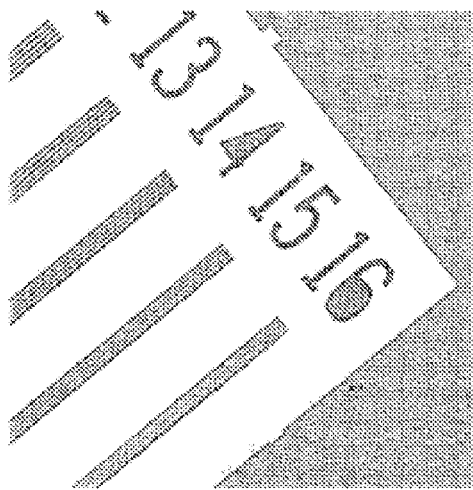

Three standard phantoms (a phantom is a known object test pattern as used herein) with spatial patterns developed at the University of Toronto, for the evaluation of digital mammography systems, were used to study the resolution of SiPD. The first set of patterns were made by depositing 50 micron thick copper strips Onto film with varying spatial frequency. The highest frequency used was 16 lp/mm. The x-ray image of this phantom taken with a SiPD is shown in FIG. 5(*a*). A filtered image is also shown (FIG. 5(*b*)) next to the raw image. (The computer images are significantly better than printout.) The advantage of online image filtering can be seen that the filtered image enhances the spatial frequency significantly. The images show that even the 16 lp/mm pattern is clearly discernible which is about the Nyquist limit for 30×30 micron$^2$ pixel size.

FIGS. 5(*a*) and 5(*b*) show images of copper strip patterns deposited on film. The density of the pattern starts from 16 lines per millimeter (lp/mm) (bottom cluster) and decreases with 1 lp/mm moving towards the top. FIG. 5(*a*) is the raw image received straight from the detector without enhancement, and FIG. 5 (*b*) is the filtered image.

Another phantom with a pattern of 50 micron thick lead lines deposited on a plastics plate was also used. The lines were made to expand radially from a central disk. The divergence angle of each line was 2° and the central disk was 2 mm diameter FIG. 6(*a*). The highest spatial frequency of this pattern was at the edge of the central disk, where it was approximately 14 lp/mm. A filtered image also shown next to the raw image FIG. 6(*b*).

The pre-sampling modulation transfer function (MTF) of the detector was determined from measurement of the edge spread functions (ESF) provided by positioning a 0.4 mm thick tantalum plate with a straight edge between the x-ray tube and the detector. The tantalum plate masked about one half of the field-of-view of the detector. The edge was placed at approximately a 2 degree angle with respect to the detector columns. In this way, images were formed consisting sets of ESF's with 1 ESF per line. The ESF from each line was displaced 1/30 to 1/50 of a pixel with respect to adjacent lines, depending upon the angle of the edge. Using the method of Judy, the ESF sets were combined to yield a 10 times oversampled ESF. The oversampled ESF was then numerically differentiated to obtain the line spread function (LSF), and the modulus of the Fourier transform of the normalized LSF was calculated to obtain the MTF.

Figure 6A:
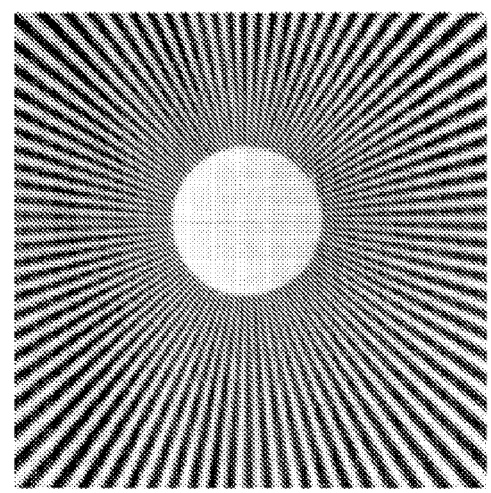
FIGS. 6(a) and 6(b) show images of a phantom with radially diverging 50 micron thick lead lines.
Figure 6B:
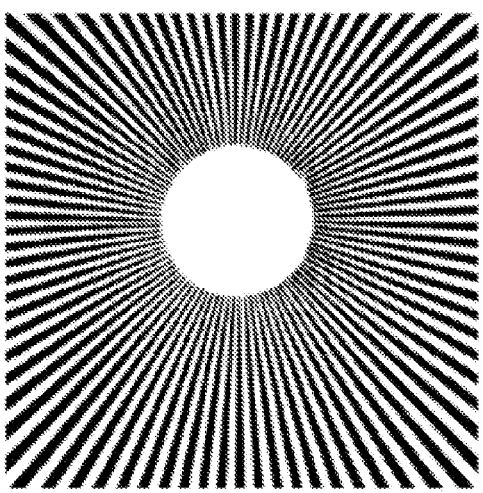

FIGS. 6(*a*) and 6(*b*) show images of a phantom with radially diverging 50 micron thick lead lines, FIG. 6 (*a*) shows the raw image received straight from the detector without enhancement, and FIG. 6 (*b*) is the filtered image. The highest spatial resolution, 14 lp/mm, near the central disk is clearly discernible.

Figure 7:
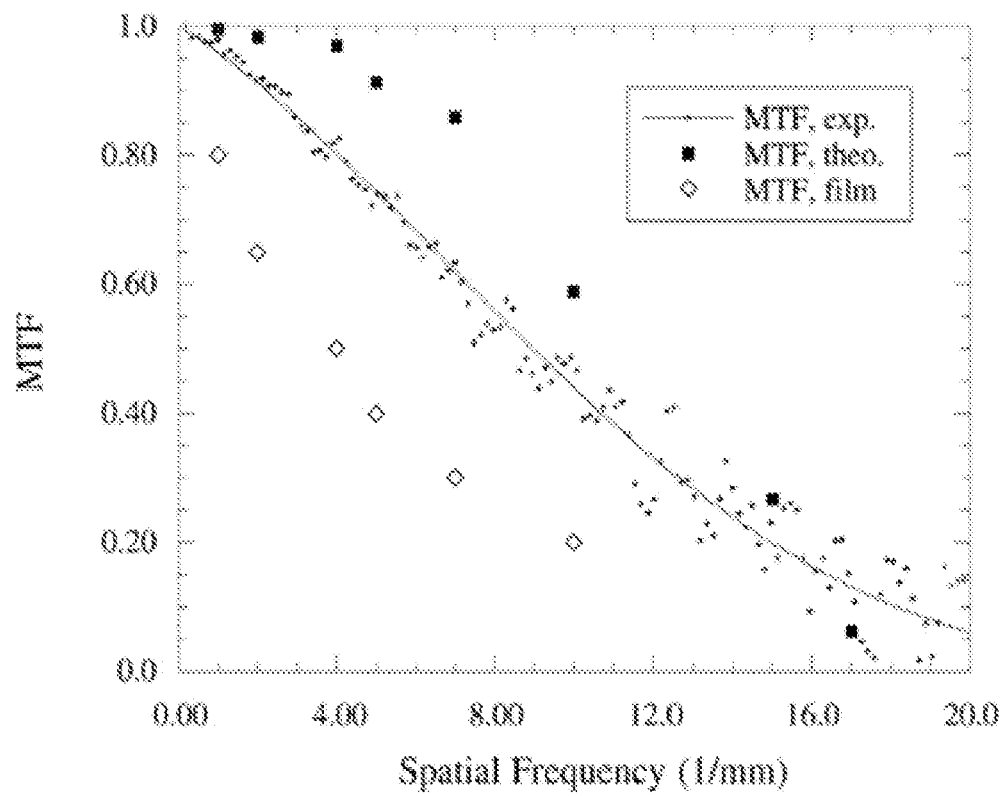
FIG. 7 shows a modulation transfer function (MTF) of the SiPD with 30×30 micron$^2$ pixel size. It is about 44% at 10 lp/mm and extends comfortably beyond 16 lp/mm. The theoretical calculated MTF and the MTF of the film system is also shown for comparison.

This method of calculating the modulation transfer function (MTF) prevents aliasing and sampling errors due to the size, shape, and spacing of the detector elements. FIG. 7 shows the MTF for an SiPD. It is about 44% at 10 lp/mm and extend comfortably beyond 16 lp/mm. The theoretical calculated MTF and the MTF of the film system is also shown for comparison. FIG. 7 shows a modulation transfer function (MTF) of the SiPD with 30×30 micron$^2$ pixel size.

Figure 8:
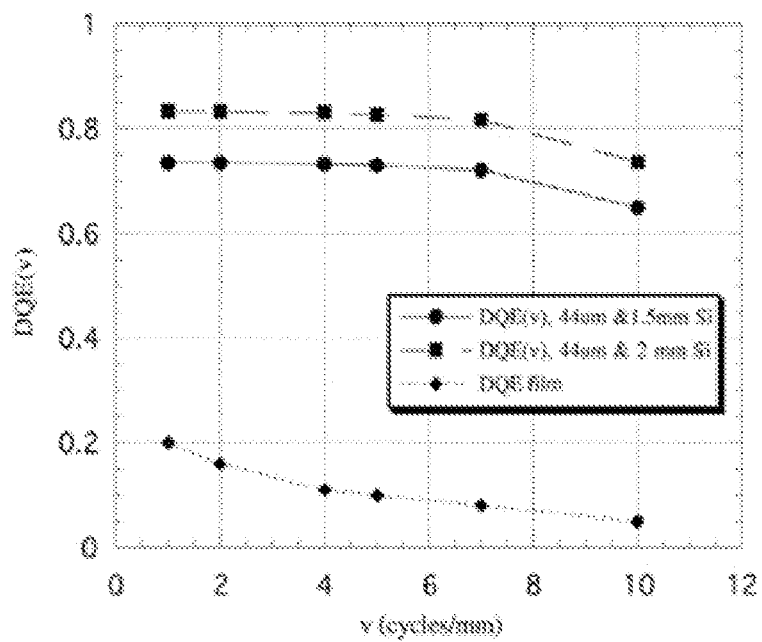
FIG. 8 shows the calculated DQE curves for SiPDs with 44×44 micron$^2$ pixel size and 1.5 and 2 mm thickness. The DQE for screen-film system is also shown.

A graph of calculations carried out to determine the Detective quantum efficiency DQE is shown in FIG. 8. Measurement of the DQE for the sample SiPDs could not be carried out as they were not optimum for application to digital mammography. The DQE was measured using the new prototype SiPDs developed specially for x ray detection as discussed below. The preliminary calculations show that the DQE of a SiPD could be larger by a factor of 10 than that of screen-film, at and above 10 cycles/mm.

FIG. 8 shows the calculated DQE curves for SiPDs with 44×44 micron$^2$ pixel size and 1.5 and 2 mm thickness. The DQE for screen-film system is also shown. The DQE is calculated with estimated electronics noise spectrum $W_{noise}(v)$ =5×10$^{-3}$@20 keV and 1 µGy/mm$^2$ dose at detector input. The number of quanta used in the calculation was 6,300 q/mm$^2$.

SiPD for Mammography

The preliminary specifications determined for a prototype SiPD optimized for a scanning digital mammography system are presented below:

| Optimized SiPD Specifications | |
|---|---|
| Pixel size | 50 micron × 50 micron |
| Number of pixels | 512 × 64 (or 512 × 128 if possible) |
| Sensitive length | 22.5 mm |
| Sensitive width | 2.8 mm for 64 pixel TDI (5.6 mm for 128 pixel TDI) |
| Efficiency | 78% @ 20 keV for 1.5 mm thickness (87% for 2 mm thickness) |
| Fill factor | 100% |
| Frame rate | 1,400 Hz |
| TDI | On-chip TDI using a CCD type circuitry |
| Output data resolution | Digitized to 12 bits @ 900 kHz output rate (1 output per chip) |
| Linear full well capacity | 56 × 10$^6$ electrons (corresponds to 10,000 incident x rays per pixel) with charge splitter |
| Readout noise | <20,000 electrons RMS (corresponds to approximately 3.6 incident x-ray quanta per pixel) |
| Image size | 22.5 cm × 30 cm (approximately 5,100 × 6,800 pixels) |
| Image data (12 bits) | 35 Mega pixels |
| Data rate (for 4 s scan) | 17.5 Megabytes/s (1.75 Megabytes/s/SiPD) |

Time Delay Integration

Figure 9:
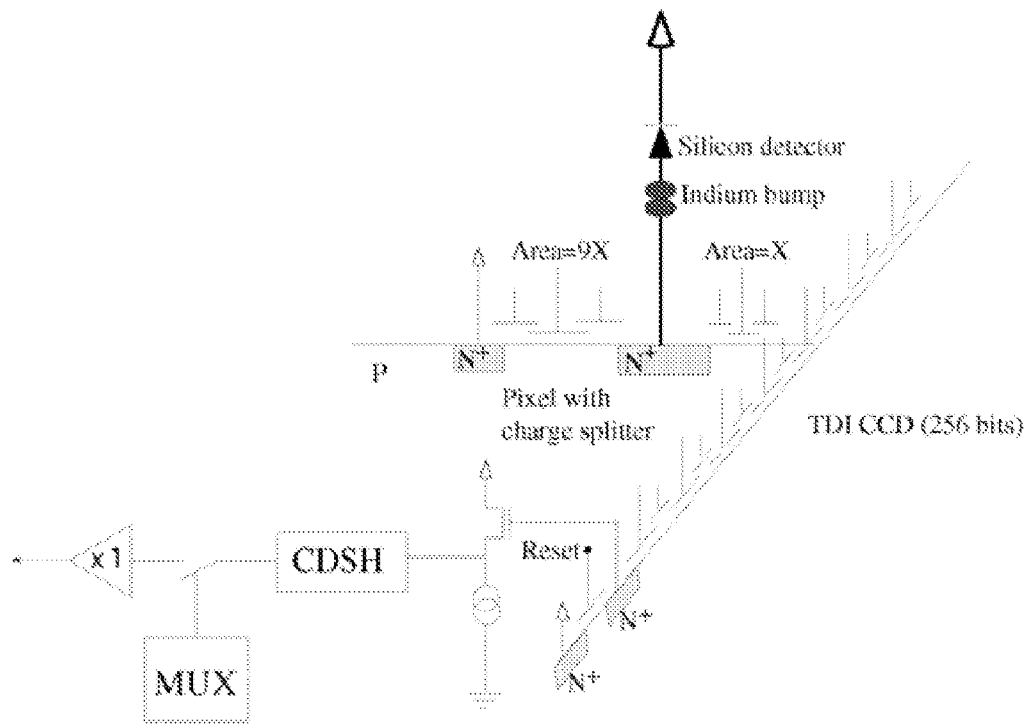
FIG. 9 shows the on chip TDI-CCD readout architecture for the SiPD readout electronics.

If it were possible to produce an exceedingly narrow, high intensity x-ray fan beam, hypothetically, the chip would need only to have a single row of pixels with which to scan the imaging area. Since the x-ray tube technology does not exist to produce such a beam, it is necessary to use a wider beam, and shift and co-add multiple frames of data from the chip in order to construct an image. A direct technique for accomplishing such a task would be to rapidly readout all pixel data form the chip and shift and co-add the frames after digitization, using a digital signal processor. However, the well known time-delay integration (TDI) technique accomplishes the same goal on the sensor chip without requiring large-bandwidth processing. In the TDI technique, the pixels are constructed such that the signal from one pixel can be passed to its neighbor in the scan direction at a rate which is synchronized with the mechanical scanner, and the neighbors signal is added to the signal being passed in FIG. 9. The signal passing and adding is accomplished using a structure known as a charge-coupled device (CCD). FIG. 9 shows the on chip TDI-CCD readout architecture for the SiPD readout electronics.

A single cycle, or frame for the readout consists of charge integration in the pixel, transfer of the integrated charge into the CCD, and finally, advance of the CCD by one pixel. The frame rate of the readout will be synchronized with the mechanical scanner such that a given charge packet in the CCD is always under a single point on the patient for the entire scan. For a scan rate of 75 mm/s, the corresponding frame rate is 1,700 Hz.

The TDI can be done either through software during the data acquisition or analysis phase or through hardware built inside the ASIC readout chip or external to the readout chip. Two charge transfer methods between silicon PIN diode and CCD readout chip are disclosed. The concepts are shown schematically in FIGS. 10(a) and 10(b). The two methods are the direct injection and gate modulation. In the direct injection method, charge from the detector is accumulated in the input well within the unit cell while the charge in the CCD is transferred from one cell to the next. The accumulated charge is then transferred into the CCD well at the end of the integration time and the transfer cycle repeats. In the gate modulation method, the charge from the detector fill up a capacitor and the voltage of the capacitor is directly proportional to the charge amount. The voltage then controls the potential of a CCD gate which will determine how much charge will be remained in the CCD well. By making the transfer period equal to the time it takes to scan the height of one pixel, the charge representing the x-ray flux through a given point in the patient will be accumulated in the same CCD well as it traverses the readout.

Figure 10A:
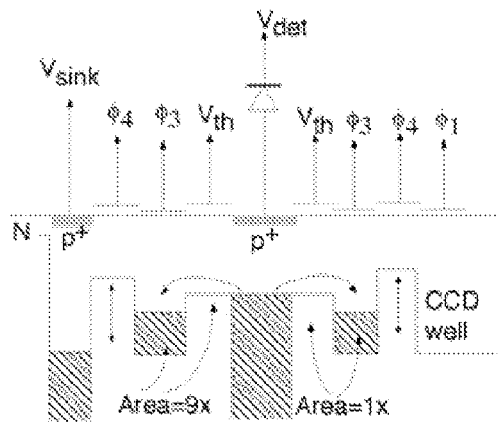
FIG. 10(a) is a direct injection circuit.
Figure 10B:
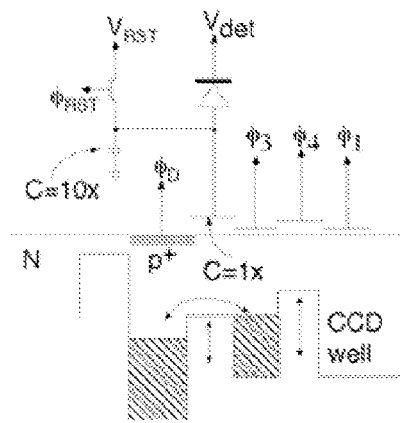
FIGS. 10(b) and 10(b) show the TDI-CCD circuit with charge splitter.

Because of the large charge handling capability required, a charge splitting circuit is used for both type of input methods. The splitting ratio will let 90% of the charge to be disposed and the 10% passed on to TDI-CCD to form the image. The charge splitting circuits are also shown in FIGS. 10(a) and 10(b). For the direct input method, the splitter operates by having two accumulation wells which have a 1:9 area ratio. In the gate modulation method, the splitter operates through an extra capacitance connected to the detector. In this case, the splitting ratio can be controlled by the ratio of the extra capacitance and the capacitance of the CCD gate. Another possibility is to divide the TDI range into several sections and sum them externally inside or outside the readout chip.

At the output of the CCD, the charge is detected in the usual way by transferring it onto a reverse biased diode and detecting the voltage change on the diode capacitance. The voltage signals from each column will then be multiplexed to the SiPD output. FIGS. 10(b) and 10(b) shows the TDI-CCD circuit with charge splitter, FIG. 10(a) is a direct injection circuit, and FIG. 10(b) is a gate modulation (fill and spill) circuit.

The SiPD

A new optimized SiPD which is significantly modified and fully optimized for application to ultra high resolution x-ray detection is disclosed.

A calculation was performed to estimate the x-ray imaging quality of the proposed detector system. The silicon PIN diode pixel array for the SiPD was assumed to be between 1.5 and 2 mm thick with a 44×44 micron² pixel size. The breast tissue is modeled by 5 cm thick phantom made of water. It was assumed that a parallel beam of 20 keV x rays with 1 Roentgen exposure is incident on the phantom. The silicon pixel detector array is placed below the phantom. The scatter grid was not used in the calculations.

The total number of detected x-ray photons per pixel, N, can be calculated as:

$$N = N_0 \exp(-\mu_w x_w)(1 - \exp(-\mu_s x_s))$$

where $N_0$ is the incident x-ray flux, $\mu_w$ and $\mu_s$ are the transmission coefficients for water and silicon, and $x_w$ and $x_s$ are the thicknesses of the water and the silicon pixel detector active area.

For the digital mammography system, the dominant factor limiting the image quality is the photon statistical noise and scattered photon background. The statistical noise is given by $\sqrt{N}$. With 1 Roentgen of exposure incident on the phantom, statistical noise for a single pixel for the proposed system is approximately 10 x-ray photons for the x-ray energy range of 20 keV. Where the electronics noise for the proposed system is only 3.6 x-ray photons. Therefore, the image quality is determined by the photon statistical noise. This is a significant improvement over the screen-film based systems, where the film grain noise is comparable to statistical noise especially at high spatial frequencies. The scattered photon background can be reduced to less than 10% of the primary signal for linear array scanning mammography systems. Furthermore, state-of-the-art digital image processing and enhancement techniques can be applied to optimize the performance.

The Modulation Transformation Function (MTF)

Figure 11:
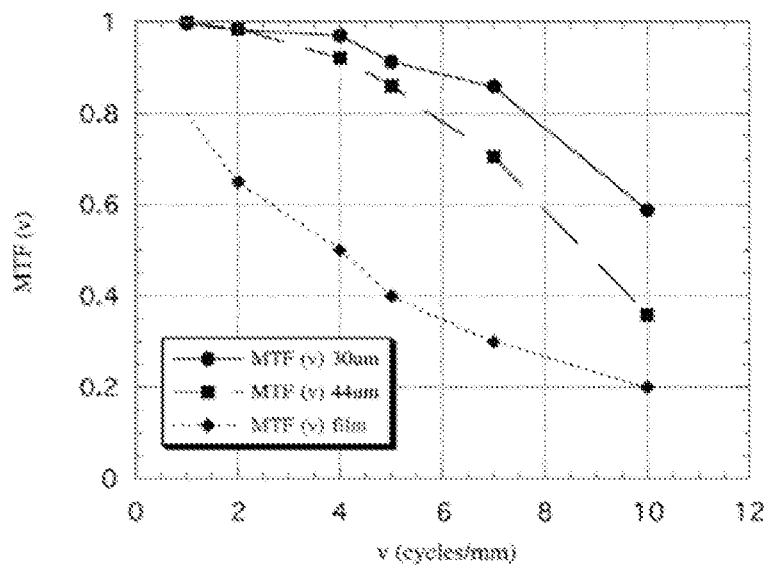
FIG. 11 shows the MTF of a 30×30 micron$^2$ pixel detector (solid line), 44×44 micron$^2$ pixel detector (long dashed line) and standard screen-film system (standard screen+Kodak Ortho MA film).

FIG. 11 shows the MTF of a 30×30 micron² pixel detector (solid line), 44×44 micron² pixel detector (long dashed line) and standard screen-film system (standard screen+Kodak Ortho MA film). Bottom line, shown with short dashed line.

The MTF for a fixed cosine wave input pattern is defined as:

$$MTF = \frac{C_{out}}{C_{in}}$$

where C is the contrast if the image defined as:

$$C = \frac{I_{max} - I_{min}}{I_{max} + I_{min}}$$

and I is the intensity.

For the pixel detector with pixel width of d, the MTF can be computed from the general image represented by 1+cos (2πvx+φ), where φ is the random phase, by histograming the image with bin width equal to d and measuring the contrast C from the histogram. MTF is determined from the average over φ. The results are shown in FIG. 11.

Estimation of Detective Quantum Efficiency (DQE)

The physical quality of a diagnostic imaging system can be specified in terms of sensitivity, spatial resolution, contrast, noise, and dynamic range over which the device can be operated. One fundamental parameter describing image quality is the signal-to-noise ratio (SNR) discussed above. Reliable deductibility of structures is dependent on adequate SNR in the image. To allow consideration of the effect of detail size on deductibility, both the signal and noise can be expressed as a function of spatial frequency and their ratio as SNR(f).

The spatial frequency dependent detective quantum efficiency [DQE(f)] is a quantity which describes the ability of the imaging system to transfer the intrinsic SNR of the incident radiation signal from the breast to the final image. For a fixed input pattern the detective quantum efficiency (DQE) is defined from the signal-to-noise ratios of input and output images.

$$DQE = \frac{(S/N)_{out}^2}{(S/N)_{in}^2}$$

DQE(f) can also be written as the product of four factors as follows:

$$DQE(f) = A_Q * A_S * R_C(f) * R_N(f)$$

where $A_Q$ is the fraction of x rays that interact in the detector (quantum efficiency), $A_S$ (also known as the Swank factor) describes the statistical fluctuation (related to the width of the pulse height spectrum) resulting from when x rays are detected and converted into the final energy form, $R_C$ is related to differences in propagation of signal and noise in a detector and $R_N$ represents the fraction of total noise at each spatial frequency that is true quantum noise. Ideally, all four factors equal 1.0.

$A_S$ is ideally 1.0 but is reduced to about 0.7 in screen-film because of energy conversion losses and alternative mechanisms to light creation—i.e. the pulse height spectrum is broad. In the proposed SiPD with direct conversion, the pulse spectrum is narrow and therefore $A_S$, also known as the Swank factor, is very close to 1.0.

In screen-film imaging systems $A_Q$ is determined by the loading of the phosphor (mg/cm$^2$). This is limited, because as the phosphor becomes thicker, there is more spreading of the emitted light and the spatial resolution is reduced. In a typical mammographic screen $A_Q$ is about 0.6. $A_S$ is reduced to about 0.64 in screen-film because of energy conversion losses and alternative mechanisms to light creation—i.e. the pulse height spectrum is broad. In addition, $R_C$ is reduced in a screen due to depth-dependent absorption and diffusion differences of the light in getting to the film. $R_N$ is brought down by film granularity and is responsible for part of the frequency-dependent drop in DQE in screen-film. Because of these effects, the DQE of a modern mammographic screen-film image receptor is only about 0.3 at 0 cycles/mm and 0.1 at 5 cycles/mm.

For a SiPD with adequate charge collection bias, there should be little dependence on the shape of the point spread function of the charge with depth of x-ray interaction and therefore, $R_C$ should be near 1.0 and frequency independent. If the readout electronics are carefully designed to limit noise, $R_N$ can be kept high—a major advantage over screen-film, which, at high frequencies is always limited by grain noise. This work suggests that the DQE of a SiPD could be larger by a factor of 10 than that of screen-film, at and above 10 cycles/mm.

The limitations of screen-film mammography discussed above are in part due to the detector (e.g. restricted latitude and contrast and the presence of film granularity noise) and also to the image acquisition geometry (e.g. scatter rejection). In a digital mammography system the x-ray screen-film combination is replaced by a detector with a linear response over a wide range of exposure. The signal from the x-ray energy is converted directly or indirectly into electric charge. The magnitude of the charge is digitized to represent the degree of transmission of x rays through the breast at a particular location.

Unlike a film image with a spatially quasi-continuous distribution of information, a digital mammogram is a two-dimensional matrix of numerical values, each corresponding to a picture element or pixel within the image. The value assigned to each pixel is proportional to the x-ray transmission on a path through the breast that intersected that pixel. Since the output of the detector can be amplified, the amount of radiation used to acquire an image is determined, not by the necessity of sufficient energy to darken a film, but rather by the amount of information carried by the x-ray beam (i.e. the SNR). This enables a more dose-efficient system to be designed.

Once the image is stored in computer memory, any region of stored intensities can be displayed on a high-resolution monitor. Other forms of display processing (e.g. edge enhancement) can easily be implemented. Furthermore, images can be efficiently archived and retrieved, and transported over communications networks. There is also the potential for application of computer-diagnostic techniques on digital mammograms.

For digital imaging systems in which image acquisition and display are effectively decoupled, and contrast can be adjusted by the viewer, a more relevant image quality criterion than contrast is the SNR of the image. This describes the extent to which the display contrast of the image can be increased to reveal subtle structures before the effect of the amplified noise degrades image quality.

The Linear Array

For the large area x-ray imaging like mammography, a cost effective system may use a linear sensor (or an array of sensors) which is scanned across the imaging area, rather than a full area sensor which records the image in a staring mode as is done with film. The linear array system has interesting advantages: the scattered photon background is low, good tolerance to heart beat movements, manufacturing is cost effective, and if TDI is used it has excellent tolerance for random non working pixels which also increases sensor yield.

A new ASIC readout chip with TDI capability is designed and fabricated to build a linear sensor array which is formatted and structured for scanning operation. In the proposed hybrid silicon pixel detector (FIGS. 3(a) and 3(b)) the 1.5 mm thick silicon PIN diode array is placed onto the top of the readout ASIC chip that contains the TDI-CCD readout electronics for each pixel (the lower piece in FIG. 3(b). The two sections of the SiPD are bonded together by tiny indium bumps. Each section is fabricated by different processes on completely different substrates. Thus the hybrid process separates the detector and readout electronics and provides excellent potential for optimization of the PIN diode pixel array and the readout electronics separately. This may also lead to the development of larger arrays. The readout electronics chip is normally larger than the PIN diode array because it requires extra circuitry to buffer, supply and control the pixel readout electronics. There is also room needed for the contact pads for ultrasonic wire bonding on to the chip carrier. Therefore, abutment of the active pixel detector areas between adjacent chips is not straight forward. However, a straight forward solution to avoid gaps in the image, is to accurately place the pixel detectors into a staggered linear array formation with or without overlap between adjacent chips. FIG. 1 shows the top view of such an arrangement. This arrangement will produce a gapless sweep when moved normal to the linear array under the breast if the difference in the scan time for each chip is accurately accounted for. A small section of overlap between the adjacent chips will help to correct for larger number of defect pixels near the edges of the ASIC chip and also will help in calibration of the different pixel detectors.

The staggered array will consist of two rows of 5 chips each, covering a total width of 20 cm as shown in FIG. 1. The receptive fields of adjacent chips overlap during the image scan, so there is no loss of tissue coverage in the image.

However, there must be sufficient delay introduced between the two staggered arrays electronically so that the images produced by each linear array exactly matches in spatial content. Formation of a linear array using individual sensors also lightens the data acquisition speed and electronics requirement, because each sensor can be read out in parallel. This allows fast data acquisition and storage for the anticipated high data rates from a 4 s scan of a breast (approximately 17.5 Megabytes/s).

Silicon Pixel Detector Sensitivity

The sensitivity of the SiPDs is much higher than current semiconductor detector systems such as direct coupled CCDs without a screen. This is because the effective active thickness of the CCD detector is much smaller than the proposed detector. If CCDs are coupled to conventional fluorescent screens, there will be a loss of DQE due to the statistics of energy deposition and formation and propagation of light in the screen. There may also be loss of resolution due to diffusion of light in the screen. Direct readout systems such as the pixel detector will be important to achieve high resolution and wide dynamic range, while keeping the equivalent or better sensitivity. The SiPDs can be built with larger thicknesses. Currently, up to 1.5 mm (1,500 micron) thick detectors are readily manufactured. The thicknesses are expected to reach to 2 mm in the near future when higher resistance silicon wafers will be commercially available. Average x-ray energy imaged by the digital mammography system is in the 20 keV range because the breast hardens the spectrum by readily absorbing the lower energy photons. The quantum efficiency of the proposed SiPD is excellent for a direct readout digital mammography system, 78%@20 keV for 1.5 mm thickness (87%@20 keV for 2 mm thickness), and converter screens are not required.

FIG. 1 shows the staggered linear array system for gapless digital mammography imaging using the hybrid SiPDs. (The drawing is not to scale).

Detector Curvature

The quantum efficiency of the silicon detector is determined by the thickness of the active layer. In principle, increased thickness is advantageous, however, certain considerations must be dealt with. For example, as the detector becomes thicker, incident x rays not normal to the surface of the detector may pass into an adjacent element, giving rise to loss of spatial resolution. For a flat detector of 18 cm width, the lateral spread due to this angular incidence will be greater than 190 micron at the edge of the field. To obviate this problem, the detector will be curved along its long axis with a radius equal to the x-ray source-detector distance (about 70 cm) so that all incident primary x rays are at normal incidence. The curvature will be achieved by forming the detector from multiple subunits, each of which is a hybrid SiPD, approximately 20 mm in length (FIGS. 2(a) and 2(b). (The depth effect for such a SiPD with 1.5 mm active volume thickness is about 25 micron, within the 50 micron pixel size.) This is much more practical and cost effective than attempting to fabricate a single, long detector chip.

Detector Operation Temperature

The new SiPDs are designed for room temperature use. However, if high quality operation cannot be achieved at room temperature or if room temperature operation cannot be maintained due to electronics power dissipation then electronics cooling for the SiPDs may become necessary. Also lowering the temperature by several degrees may significantly improve the image quality by lowering electronics noise. The cooled device must be maintained in a dry environment or above dew point, otherwise condensed water will raise leakage currents dramatically.

Cooling to reduce noise can be done using thermoelectric (Peltier) coolers. These devices mount directly under the hybrid pixel detectors and transfer heat away from the ASIC chip (pixel detectors).

Lateral Scanning System

FIGS. 2(a) and 2(b) show a preliminary layout scheme for fabricating a full size uniform digital mammography system without gaps using an array of smaller size pixel detectors. The geometry of the pixel array and readout electronics hybrid on the left leads to a uniform 2-dimensional active area construction. The figure shows how they could be staggered to produce a uniform detector response when the linear array sweeps under the breast.

The proposed linear detector array will be mounted on an accurate swing arm and the array will be scanned laterally under the patient's breast (FIGS. 2(a) and 2(b). This geometry is preferred as it allows the linear array to accelerate to uniform speed before starting to image and to begin deceleration only after passing beyond the desired imaging field. It also allows a close approach of the detector to the chest wall to minimize missed breast tissue.

Data Acquisition Electronics

Figure 12:
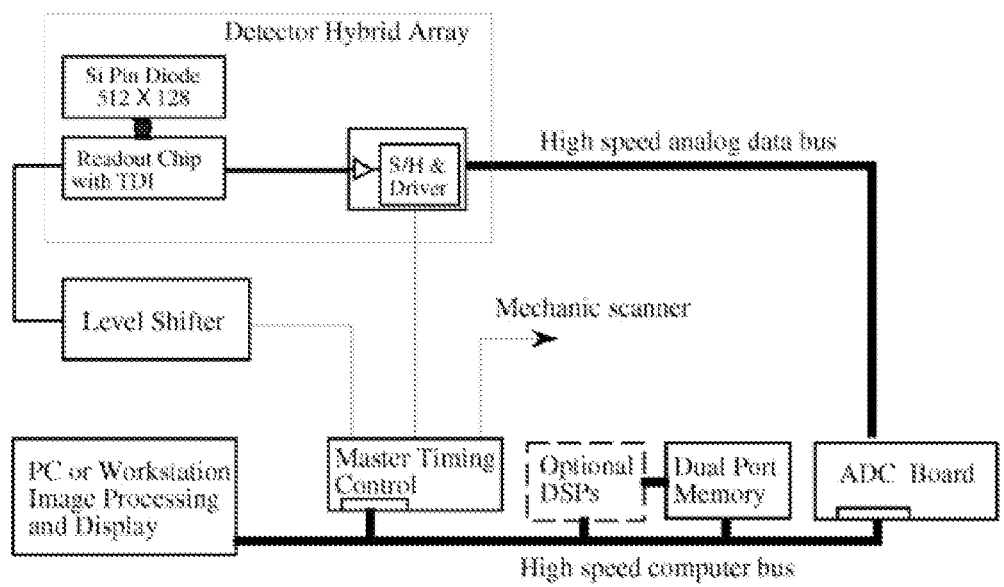
FIG. 12 shows a block diagram of the data acquisition system.

The scanning digital mammography detector system is made of 10 detector hybrids each with one multiplexed analog output channel. All the detector hybrids are driven by the same scanning clock signals. A simplified interface electronics block diagram is shown in FIG. 12. A master timing control card directly interfaces with the computer bus to generate proper scan control signals for mechanical and electronics scanning, and control of the data acquisition sequence. The electronics scan signals go through a level shifter board to generate proper signal levels for the readout chip. The analog outputs of the readout chips are buffered and sampled before they are put on the analog data bus. The analog data bus is expected to carry 10 different analog signals from the detector assembly. With a 1,700 Hz frame scanning rate, the data rate on the analog data bus are expected to be 900 kHz for each chip. This is a moderate data rate for today's state-of-the-art technology.

The analog data from the detector assembly are digitized by 10 independent 12 to 14 bit precision analog-to-digital converters (ADCs). There are many off-the-shelf ADCs are available that can meet the requirements. The digital data stream is transferred to a 80 megabyte dual port memory. One or several digital signal processors (DSPs) built on the ADC board can access the image data through one of the memory ports. A bandwidth of over 50 MB/s can be implemented easily between the DSPs to dual ported memory. This provides capability of realtime data processing. For example, the detector response gain can be automatically corrected with these DSPs, or a no loss data compression algorithm can be implemented.

The data of the image can be accessed by a computer through a high speed computer bus. There are several options for the computer bus system that can be used. For example, if an IBM-compatible computer is used for the host computer, the local bus can be used to interface the ADC board and computer. The data of the image will be stored on the computer hard disk for post image processing, and can be archived onto magnetic tapes or optical compact disks (CDs) or Digital Video Disks (DVDs) for permanent storage.

Radiation Hardness of SiPDs

Because of the hybrid design of the proposed detector, both silicon PIN diode pixel array detector and readout chip can be optimized separately for radiation hardness. The silicon PIN diode detector is naturally radiation hard. It is a factor of a thousand better in radiation hardness than the silicon microstrip detectors, which have been manufactured with a radiation hardness level of about 1 MRad. The readout electronics chip can be designed and fabricated using one of the available radiation hard manufacturing techniques. Radiation hardened chips have been manufactured and demonstrated which can stand up to 1 MRad of Cobalt-60 gamma rays. Therefore, the proposed SiPDs can be manufactured with excellent radiation tolerance. A radiation hardness level of 1 MRad is equivalent to about a 1 million exposure life time. Therefore, effects of radiation on the system lifetime should not be a concern.

Full Area Detector

A full area detector system can also be fabricated using pixel detectors tiled in two dimension. For this application the ASIC readout chip has to be a staring array and does not need to have TDI capability.

For linear pixel detector array system the image is acquired by scanning the fan x-ray beam and the slot detector across the breast in a direction parallel to the short dimension of the detector. To allow a smooth mechanical motion, the images are acquired using a time-delay integration (TDI) technique similar to that described by Holdsworth. As the detector is moved across the breast at constant speed, the charge collected in each element of the detector is shifted down its column at the same speed as the scan, but in the opposite direction. When the charge packet reaches the last element in the detector, the charge signals in the columns are read out at high speed. In this way, the signal corresponding to a given pixel in the image is acquired by integration down the columns of the detector.

An advantage of the TDI acquisition is that both dark current and detector uniformity corrections can be made by acquiring "image" data first without x rays and then with a uniform x-ray exposure to the detector and storing one offset correction and one gain factor for each of the detector columns. With the same detector operated in non-TDI mode, 256 times as much memory would be required for correction tables. With an area detector, it is likely that correction factors would be required for each pixel of the image, resulting in at least 32 Mbytes of memory required for look-up tables.

Another advantage of TDI is its tolerance for bad pixels. Occasional dead pixels in the detector array will produce negligible effect since it is integrated over 100 pixels. This relaxes the selection criteria, enhancing yield and decreasing the cost. On an area detector dead pixels cannot be tolerated and perfect chips must be selected. Another advantage is that the TDI can also be made in stages that is in groups of pixels and then the each section is summed internally inside the readout chip or externally by hardware or software. The TDI stages may also be cascaded to produce more flexibility.

Collimator

Federal regulations require that only the part of the breast covered by an active sensor element must receive radiation. This will require the design and fabrication of a collimator which will directly match the active sensor areas of the staggered linear array.

Detectors with higher DQE is an important enhancement. Thicker silicon PIN diode arrays with 2 mm thickness which can increase the detector DQE are expected to be commercially available soon. However, the detector thickness will be too large and the depth effect, x-rays entering adjacent pixels due to the fan beam, will become important. There are also semiconductor materials with higher atomic number than silicon which can be used for x-ray imaging. Some of these materials such as CdTe, CdZnTe, Se and GaAs hold greatest potential.

CdZnTe is Cadmium Telluride (CdTe) doped with 20% ZnTe to form $Cd_{1-x}Zn_xTe$. Significant progress has been made in the last several years to perfect the crystal growing process. The result is a high quality crystal suitable for x-ray detection. The CdZnTe crystal contains elements with relatively high atomic number, and has a density of 6 $g/cm^3$. The energy bandgap of the material is large (approximately 1.47 eV), which results in ultra low dark current. This allows the detection of x rays at room temperature. For x-ray energies of 15 to 25 keV, the quantum efficiency of a 500 micron thick CdZnTe detector is nearly 100%.

Detector grade CdZnTe crystals are available. The crystal has been used for gamma ray detection by several groups. The long term stability of CdZnTe detectors has been demonstrated by Butler, et al. in *Recent Developments in CdZnTe Gamma-Ray Detector Technology* (SPIE Int'l Symposium, 19-24, July 1992, San Diego 1992a) and incorporated herein by reference. Different geometries and shapes of detectors have been constructed. A strip detector of 3.2 cm×3.2 cm size has been developed by Aurora Technologies Corporation (ATC) and recently a pixel detector with 64×64 pixels of 0.4 mm×0.4 mm pixel area has been developed for use in a pin hole single photon emission computed tomography (SPECT) system.

CdZnTe Pixel Detectors

A purpose of this embodiment of the invention is to approach an ideal mammography system where the DQE is $\geq 85\%$, limiting resolution is $\geq 10$ lp/mm, there is ultra low noise, accurate linear response and high dynamic range are $\geq 4,000$ ($\geq 12$ bits). A mammography system with such specifications can bring major improvement to early detection of breast cancer by enhancing image acquisition (performance of the x-ray detector). This can be accomplished by use of wide dynamic range, high spatial resolution CZT pixel array detectors which efficiently absorb x-rays transmitted by the breast in a mammographic examination and directly and precisely convert their energy to an electronic signal that can be digitized and stored in computer memory as an image matrix.

Anticipated Results for Image Acquisition (Source/Detector)

Prototype hybrid CZT pixel detectors hybridized by indium bump bonding onto NOVA's readout ASIC chips will be developed and tested. At the end of the proposed two year research a larger proposal will be submitted for translating the developed detectors into commercial digital mammography sensor arrays. The preliminary specifications of the proposed direct conversion digital mammography system are given in Table I.

TABLE I

Expected detector performance specifications

1. Pixel detector size: Pixels ≦50 × 50 micron with 100% fill factor, with each detector module containing up to 128 × 512 pixels.
2. Quantum efficiency: ≧99% by selection of adequate thickness of the detector intrinsic region and reduction of the thickness of the blocking layer.
3. High modulation transfer function (MTF) and detective quantum efficiency (DQE): A limiting spatial resolution of 10 lp/mm and a DQE of well over 80% at zero spatial frequency is anticipated.
4. Dose: Reduction of patient dose by a factor of approximately 6-8 can potentially be achieved without loss of image quality because of improved detective quantum efficiency (DQE) of these high Z, direct conversion detectors (factor of 3-4) and elimination of the scatter grid (additional factor of 2). This will make it safer for the patients to have more frequent mammograms.
5. Dynamic range: ≧10,000 (Limited to 4,096 (12 bits) for this project) @ 900 ksamples/s output rate.
6. Number of electrons produced per interacting x-ray quantum: Approximately 5,600 electrons detected for a 25 keV x-ray photon.
7. Linear response and well capacity: Throughout the dynamic range with well capacity of ≧5.6 × $10^7$ electrons (corresponds to 10,000 incident x rays per pixel).
8. Readout noise: <20,000 electrons RMS (corresponds to approximately 3.6 incident x-ray quanta per pixel).
9. Active area: (0.32 to 0.64 cm) × 24 cm linear array for scanning up to 30 cm length to cover the full breast.
10. Image size: 4,800 by 6,000 pixels.
11. TDI channels and Scan time: On chip ≧128 pixel TDI channels and ≦4 s scan time.
12. Operation temperature: Room temperature design is planned.
13. Breast tissue coverage: The low profile detector array will help maximize coverage of the breast tissue.

Direct Conversion Pixel Detectors

The first silicon pixel detectors tested were staring focal plane arrays developed by the Hughes Aircraft Company (HAC) for visible wavelength applications. Although they were made for visible light imaging HAC detectors were evaluated and found to have excellent x-ray imaging capability which is also demonstrated for nondestructive evaluation. The detectors of this invention have a completely different readout electronics which is specially designed and optimized for x-ray imaging for digital mammography with time delay integration (TDI) capability. In TDI acquisition, the detector and x-ray source move across the breast while the charge collected in the wells of the CCD readout are transferred down columns of the CCD at the same speed but in the opposite direction, thus providing low noise integration of the detector signal and permitting a long, narrow detector to be used to produce a large area image. A major advantage of this approach is that the x-ray beam is in a slot format, providing highly efficient rejection of scattered radiation from the imaging system. The silicon pixel detectors provide improvements beyond the first generation phosphor-fiber-optic-CCD systems. However, the DQE will be limited (approximately 50%) due to the low atomic number (Z=14) and low density (2.3 g/cc) of the silicon. Therefore, the detector thickness required is 2-4 mm to achieve acceptable DQE performance.

The CdZnTe (CZT) pixel detector array is denser (6.2 g/cc) and higher Z material (Z approximately equals 50) to bring the DQE very close to an ideal detector, about 4 times higher than film-screen systems. The readout chip for the silicon pixel detectors can be modified to read out the CZT pixel detectors. Selenium and GaAs detectors can also be used to achieve high DQE pixel detectors.

For 15 to 35 keV x-rays used in mammography, the important detection process is almost entirely the photoelectric effect for CdZnTe. Using the x-ray linear attenuation coefficients for CdZnTe, the average thickness of the detector can be determined to be approximately 0.5 mm for approximately 99% absorption of x-ray energies used in mammography.

Raytheon, Santa Barbara Research Center (SBRC) has fabricated the CdZnTe pixel detectors. These are similar in operation to our silicon pixel detectors, which have been evaluated for low energy x-ray imaging applications, but have much higher quantum efficiency for a given thickness. These detectors were manufactured with pixel dimensions ≦50×50 micron for digital mammography and with active areas, up to about 1×2 cm per chip. The operating principle of the CdZnTe (CZT) pixel detector is similar to that of silicon pixel detectors. When x-rays are absorbed in CZT, the emitted photoelectron carries most of the energy of the incident photon and loses its kinetic energy within a few micrometers of travel by creating electron-hole (e-h) pairs FIG. 3(g). Approximately one e-h pair is created for every 4.45 eV of x-ray energy deposited, i.e. a 25 keV x-ray yields approximately 5,600 e-h pairs. The electrons and holes are separated and drift to the opposite direction by the electrical field as shown in FIGS. 3(g) and 3(h). It takes about 20 to 50 nanoseconds depending on the bias voltage and the detector active volume thickness to collect the electrons and holes at the junction and ohmic sides to produce the signal. The directionality produced by the electric field removes the isotropy of the created e-h pairs and, therefore, high spatial resolution can be achieved even for an active volume thickness of several millimeters.

A charge sensitive amplifier is connected to the pixellated side of each pixel. When the e-h pairs are created, the functions as a current source; the charge sensitive amplifier integrates the charge and produces a signal proportional to the amount of the charge created. In the proposed hybrid pixel detector (FIG. 3(h)) the 0.2 to 2.0 mm thick CZT array is placed on the top of an integrated ASIC chip that contains the readout electronics for each pixel (the lower piece in FIG. 3(h) and the two are bonded together by tiny indium bumps. Each section is fabricated by different processes on different substrate materials. Thus the hybrid process separates the detector and readout electronics and provides excellent capability for optimization of the pixel detector and readout electronics separately, and it may also lead to the development of larger arrays.

X-ray and gamma-ray detectors using photoconductive CdTe have been produced since the early 1970s. The performance of these devices, however, has been severely limited by the inherent impurity and crystal imperfections of the material which have been reduced, but not eliminated in recent years.

The CdZnTe pixel detector is fabricated by placing a two-dimensional array of contacts on one of the surfaces with the same pixel pitch as the readout ASIC chip. The other side is also covered by a single or a structured contact approximately matching the size and position of the pixelated surface. One or more guard ring(s) can be placed on the perimeter of the pixelated and/or the opposing surface to achieve uniform detector response. The region in between the two surfaces is called the intrinsic region which is the actual detection volume. Charge generated in the intrinsic region by absorption of x-rays is swept to the contacts by the high electric field in this region, resulting in complete charge collection (signal). The low dark current at high voltages (<500 V applied) achieved results in low noise signals and excellent charge collection. The measured I-V curves show diode characteristics with resistivity above $10^{11}$ Ωcm and low leakage current less than 1 pA for pixel of about 100×100 micron area.

When exposed to monoenergetic radioactive sources, these detectors demonstrate very narrow line widths. While energy resolved imaging is not the main focus of this application, the narrow distribution in the number of charges collected per interacting x-ray, will result in a low Swank noise contribution from the detector and this will lead to improved image quality. There are two main development tasks required to permit the application of the CZT pixel detectors for medical imaging: 1) pixellating the detector material, and 2) reducing the effect of the absorbing contact layer of the CZT structure which reduces the quantum efficiency at low x-ray energies using molecular beam epitaxy.

Indium is deposited on both the ASIC chip and the CdZnTe pixel detector pixels covering a section of the pixel area in matching geometry. Then the two sections are brought together to match the geometric pattern and pressed together to produce hybrid pixel detector. This technique is called indium bump bonding technique. Other techniques such as gold bonding or solder bonding techniques are also possible.

An object of the invention is reducing contact layer absorption. The composition and basic material structure of the contact layers are constrained by the requirement to achieve the diode barrier functions. The only straightforward way to reduce the x-ray absorption of the upper "dead" layer is to reduce its thickness. Two methods are discussed for achieving this: 1) Fabricate a modified, thinner design with the current liquid phase epitaxy (LPE) process. However, the capability to make very thin layers is limited. 2) An alternative approach is Molecular Beam Epitaxy (MBE). MBE is a newer technique which is approaching the performance of LPE for manufacturing infrared detector devices, and is capable of fabricating monolayer thickness films. The aim is to produce arrays with efficient x-ray detection over the x-ray spectrum for digital mammography (20 to 35 keV) and other radiography applications ranging from 10 keV to 150 keV.

Front-End Readout Electronics Integrated Circuit for CdZnTe Pixel Detectors

Monolithic mixed signal ASIC chips for the front-end electronics are discussed. The focal plane readout chip developed for high resolution silicon pixel detectors can be applied to the proposed CZT pixel detectors with some modification such as changing readout mode from holes to electrons. It is designed with TDI capability which is essential for the proposed direct conversion digital mammography system. A 2×2 mm area "Tiny Chip" version has been manufactured and a 1 mm thick silicon pixel detector indium bump bonded on it. This hybrid silicon pixel detector has been tested. A state-of-the-art laser based testbed has been developed and can be used for testing and evaluating the components of the proposed CZT pixel detectors once they have been hybridized onto the modified readout chips.

The hybrid detector's pixels are directly read out by charge sensitive amplifiers and analog multiplexers placed in direct low resistance contact through the indium bump bond. This forms an ideal detector-readout system, because it has the minimum possible stray coupling capacitance and the CZT pixel capacitance is also tiny ≪1 pF. Indium bump bonding is a state-of-the-art technique which has been invented and implemented by SBRC. Although it is expensive for low volume quantities, production-quantity bump bonding machines are available and the technique has good potential for cost effective mass production.

The modified readout chip will use a direct injection surface channel CCD-TDI technique for transferring charge from pixel to pixel. This technique among two others was incorporated into the first version of the chip and gave the best results during testing. This technique can also handle the large charge output from the direct conversion CZT pixel detector. Each x-ray photon (15 to 35 keV) will inject from 3,400 to 7,900 electron-hole pairs into the CCD well, much larger than about 10 electron-hole pairs injected by phosphor coupled CCD arrays. Large charge deposition has the potential to limit the dynamic range of the pixel detector due to well saturation at large x-ray flux. One solution to this problem is to design charge splitting which reduces the charge signal per x-ray by ≧90%. This solution is not optimum as it effectively reduces the most important gain from a direct conversion detector, large and accurate creation of charge. NOVA has developed a new proprietary technology where the charge per pixel is preserved but the TDI channels are divided into several groups to meet the high dynamic range requirement. The second full size version of the integrated ASIC readout chip using the new technique is now fabricated.

Exquisite spatial resolution possible with these direct conversion detectors. With the use of more appropriate materials (CdZnTe) and a TDI readout it is expected that this level of image quality will be maintained and improved, while at the same time providing higher radiation dose efficiency. The original images are significantly better than those reproduced here and show that even the 16 lp/mm pattern is clearly discernible which is about the Nyquist limit for the 30 µm pixel size in this detector.

A major advantage of the CZT detectors over silicon is their high atomic number and density. High quantum efficiency can be obtained with very thin detectors. This eliminates the problem of resolution loss due to parallax resulting when a flat detector assembly is used with a diverging x-ray beam. Also because the detector is electrostatic, the lateral spread of electron-hole (e-h) pairs is limited by the large collection bias of several hundred volts. This offers the potential for achieving higher spatial resolution than that available with phosphor-fiber-optic-CCD type systems.

The proposed linear detector array will be mounted on an existing swing arm developed at UT/SHSC for evaluation. This group has already developed appropriate techniques for careful evaluation of the performance characteristics of digital mammography detectors. We will test and measure the electrical and x-ray imaging properties of the prototype CZT pixel detectors, such as quantum efficiency, sensitivity, MTF, DQE, dynamic range, gain stability, leakage currents, temperature dependence and noise properties.

Similar to the CdZnTe and CdTe pixel detectors GaAs and Se pixel detectors can be developed for digital mammography, digital radiography, industrial imaging and nondestructive imaging. Both the GaAs and the Se pixel detectors unlike CdZnTe pixel detectors work well detecting holes generated by x-ray photons. Therefore, the integrated ASIC chip can be used directly. However, the electron-hole generation by Se is much smaller and a new chip with different well capacity will be developed. In most other respects all these pixel detectors are built similarly.

High Z Deposition Type Pixel Detectors

An ideal mammography system is where the DQE is >85%, limiting resolution is ≧10 lp/mm, and there is ultra low noise, accurate linear response and high dynamic range of ≧4,000 (≧12 bits). A mammography system with such specifications can improve early detection of breast cancer by enhancing image acquisition (performance of the x-ray detector). This can be accomplished by developing wide dynamic range, high spatial resolution high Z hybrid pixel array detectors such as CdTe, CdZnTe, PbI$_2$ and Se which efficiently absorb x-rays transmitted by the breast in a mammographic examination and directly and precisely convert their energy to an electronic signal that can be digitized and stored in computer memory as an image matrix. The major improvement in this new type of deposition type of pixel detectors is the ease, cost and the time of fabrication to achieve high quality, exceptional contrast and high DQE imaging detectors with significantly reduced cost.

New low cost direct deposition techniques are being developed and studied through prototype hybrid pixel detectors using integrated ASIC chips developed for imaging such as digital mammography, radiography, industrial imaging and NDI. The preliminary specifications of this direct conversion digital mammography system are given as:

1. Pixel detector size: Pixels ≦50×50 micron with 100% fill factor, with each detector module having 128×192 (small size integrated ASIC chip) and 384×192 pixels (large size integrated ASIC chip).
2. Quantum efficiency: 95% to 99% by deposition of adequate thickness of high Z material such as CdTe with thin conductive layer formed at the top side for the application of the bias voltage.
3. High modulation transfer function (MTF) and detective quantum efficiency (DQE): A limiting spatial resolution of 10 lp/mm and a DQE of well over 80% at zero spatial frequency is possible.
4. Dose: Reduction of patient dose by a factor of approximately 6-8 can potentially be achieved without loss of image quality because of improved detective quantum efficiency (DQE) of these high Z, direct conversion detectors (factor of 3-4) and elimination of the scatter grid (additional factor of 2). This will make it safer for the patients to have more frequent mammograms.
5. Dynamic range: approximately 20,000 (16,384 (14 bits) is considered for this project) at 900 ksamples/s output rate.
6. Number of electron-hole pairs produced per interacting x-ray quantum: Approximately 5,600 electron-hole pairs are detected for a 25 keV x-ray photon in CdTe.
7. Linear response and well capacity: Linear throughout the dynamic range with total maximum well capacity of approximately 4×10$^8$ electrons or holes (corresponds to approximately 71,000 incident x-rays per pixel).
8. Readout noise: <20,000 electrons RMS (corresponds to <3.5 incident x-ray quanta per pixel).
9. Active area: (0.96 cm wide detector active width)×24 cm linear array for scanning up to 30 cm length to cover the full breast.
10. Image size: 4,800 by 6,000 pixels.
11. TDI channels and Scan time: On chip ≧192 pixel TDI channels and ≧4 second scan time.
12. Operation temperature: Room temperature.
13. Breast tissue coverage: The low profile detector array will help maximize coverage of the breast tissue.

The detectors are developed around an Application Specific Integrated Circuit (Integrated ASIC) readout chip for x-ray imaging. The integrated ASIC chip is specially designed and optimized for x-ray imaging such as digital mammography and radiography utilizing the time delayed integration (TDI) technique. In TDI acquisition, the detector and x-ray source move across the breast while the charge collected in the wells of the CCD readout are transferred down columns of the CCD at the same speed but in the opposite direction, thus providing low noise integration of the detector signal and permitting a long, narrow detector to be used to produce a large area image. A major advantage of this approach is that the x-ray beam is in a slot format providing highly efficient rejection of scattered radiation from the imaging system and provides a potential dose advantage of 2.5 times versus using an anti scatter grid. NOVA silicon pixel detectors will provide improvements beyond the first generation phosphor-fiber-optic-CCD systems. However, with silicon the DQE will be limited (approximately 50%) due to the low atomic number (Z=14) and low density (2.3 g/cc) of the silicon. Therefore, a relatively high detector thickness of greater than 2 mm is required. We can improve upon the performance of silicon by using a high Z material, CdTe, CdZnTe, Se, GaAs or PbI, which are denser (6.2 g/cc for CdTe) and higher Z material (Z approximately equals 50 for CdTe) to bring the DQE very close to an ideal detector, about 4 times higher than film-screen systems. The present ASIC is designed to detect holes generated in silicon. NOVA will use the same ASIC readout chip for the new high Z pixel detectors to show the feasibility, although detection of holes is not as good as in silicon. This will cut cost down. If the technique is shown to be feasible a modified version of the integrated ASIC chip can be fabricated specifically optimized for that detector material, for example, to detect electrons for the CdTe or CdZnTe which are less prone to trapping and will improve the performance for the CdTe or CdZnTe deposited pixel detector.

Figure 3C:
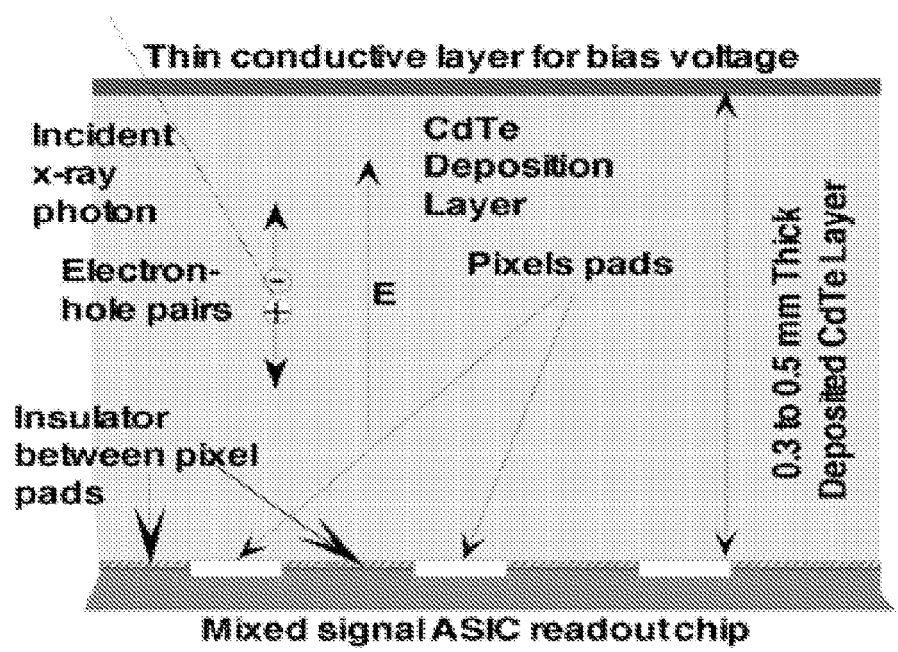
FIG. 3(c) shows a drawing of the CdTe-Pixel detector.

For 15 to 150 keV x-rays used in mammography and radiography, the important detection process is mostly the photoelectric effect for high Z (FIG. 3(c)) detectors. Using the x-ray linear attenuation coefficients for CdZnTe, the average thickness of the detector can be determined to be 0.3 to 0.5 mm (FIGS. 3(c) and 3(b)) for approximately 95% to 99% absorption for 15 to 150 keV x-ray energies.

Figure 3D:
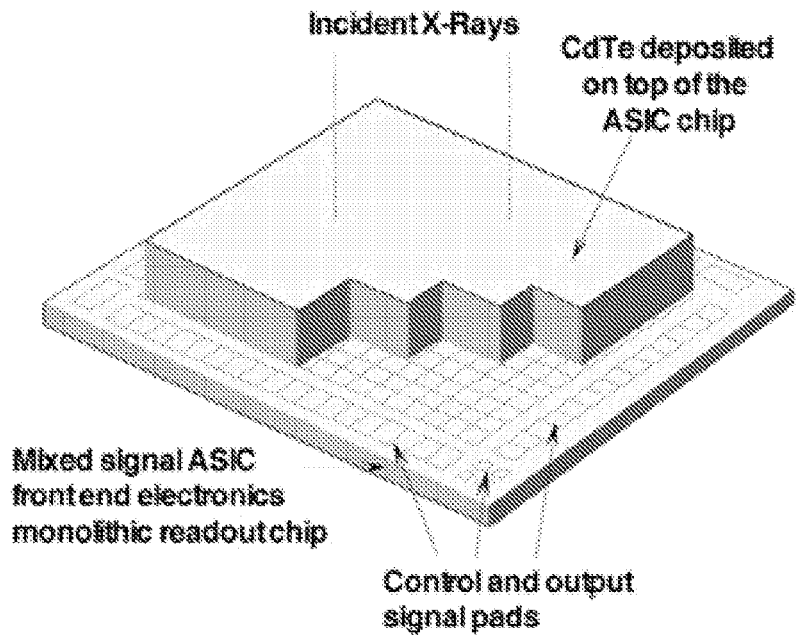
FIG. 3(d) shows a three dimensional drawing of the CdTe detector.

FIG. 3(c) shows the operation principle of the CdTe directly deposited onto the ASIC readout chip. FIG. 3(d) shows a three-dimensional drawing of the CdTe deposited pixel detector.

Figure 13:
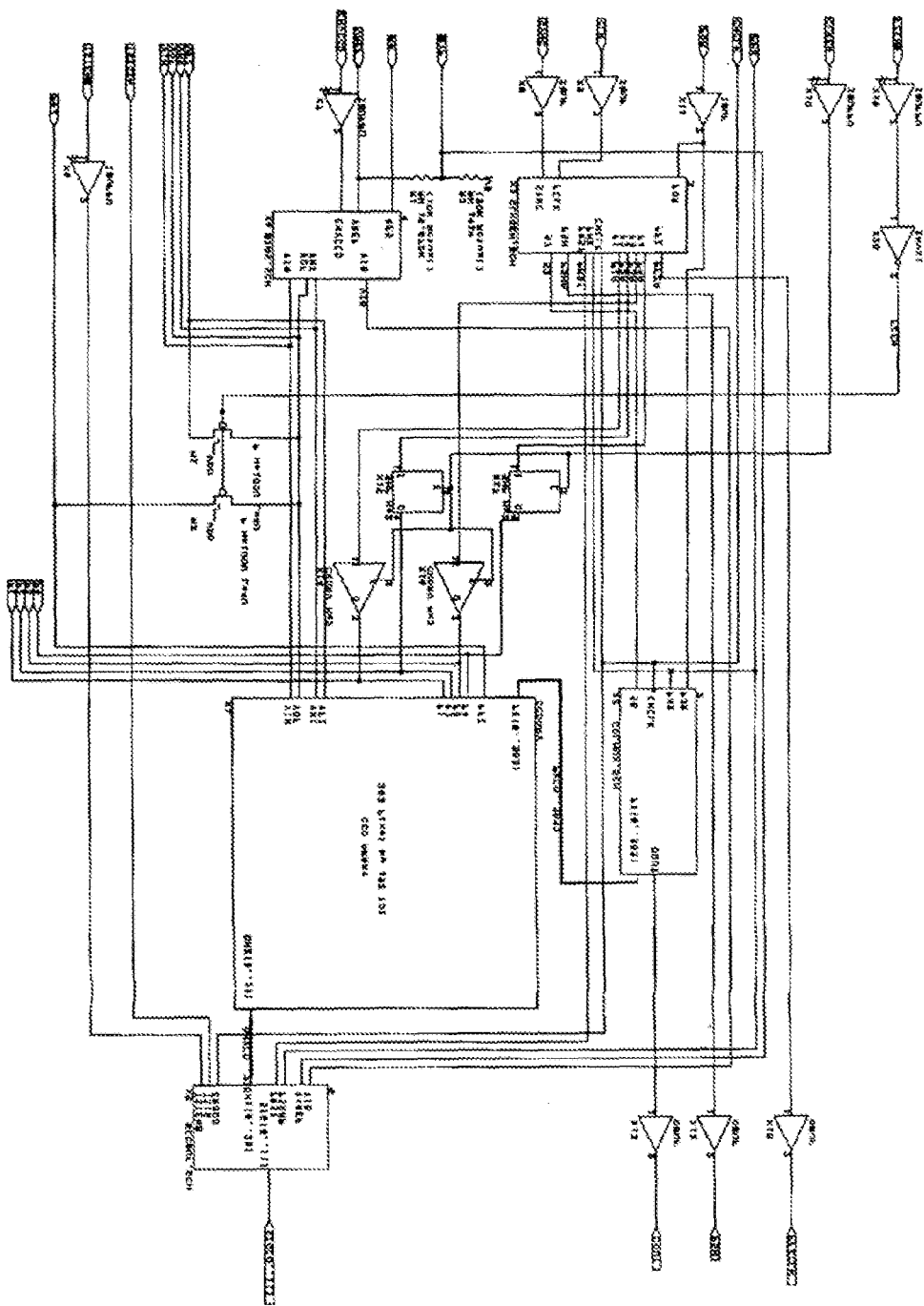
FIG. 13 shows a diagram of the integrated ASIC chip circuit used as an x-ray sensor readout device. The circuit is a scanned array imager using Time Delay Integration (TDI) technology.

The integrated ASIC readout chip for manufacturing prototype silicon pixel detectors for x-ray imaging such as digital mammography is designed to readout pixel detector arrays with 50 micron pixel size, through an Indium Bump Bonding Technology. The design of the integrated ASIC chip is based upon the test results of the TINY chip the first prototype pixel detector developed that consisted of 28×28 pixels. The integrated ASIC chip has a unique circuit design (FIG. 13). One small and one large size prototype integrated chip has been fabricated. The larger chip has the maximum size acceptable for silicon fabrication with sufficient yield. Its size is about 20×13 mm.

The integrated ASIC chip circuit (shown in FIG. 13) is used as an x-ray sensor readout device. The circuit is a scanned array imager using Time Delay Integration (TDI) technology. The CCD ARRAY block of this circuit has 384 pixel-columns perpendicular to the scan direction and 192 TDI pixel-stages in each column that are in the scan direction. The circuit reads out signals generated from x-ray sensor arrays of 384 by 192 elements with each element having a dimension of 50 by 50 microns.

The 192 TDI input stages are grouped into 24 sections with 8 inputs per section. Each TDI section has an individual output buffer, which can be read out independently. Signals from each of the 24 TDI sections are buffered by 24 amplifiers, which are in the SECBUF block.

The clock signals required to operate the imager are derived from the SYNC and CLOCK input to the CLKGEN block, which then generates the necessary clock pulses to operate the imager. External clock pulses can be applied directly to the circuit if the CLKGEN block fails to generate the clock pulses. External control of clock pulses is accomplished by pulling CLKEN low and driving the clock pads directly.

The DC biases are generated in the BIAS block. ENVCCD is high in normal operation. Forcing ENVCCD low allows external control of individual DC input levels.

Because of the high sensitivity of the detector material, a large amount of charge is produced per x-ray, about 6,000. This would cause an overload of the readout storage capacity for large x-ray flux typical in mammography. In TINY chip we split the charge and dumped about 90% to ground. However, this technique has introduced extra noise and fluctuations because it is difficult to control the charge splitting ratio accurately. Therefore, a major design improvement for the integrated ASIC chip was the elimination of charge splitting. To handle the large charge overflow, the 192 TDI pixels are divided into 24 equal sections with a readout buffer attached to each section. Since the sections are read out separately, a few overflow sections due to defective pixels will not affect the readout of other sections. This is expected to improve the accuracy and yield of the integrated ASIC chip.

The large full size integrated ASIC chip has 384 pixel columns perpendicular to the scanning direction and 192 TDI pixel rows parallel to the scanning direction. The small integrated ASIC chip is identical to the large chip with the same 192 TDI pixel rows parallel to the scanning direction but there are only 128 columns perpendicular to the scanning direction. The TDI pixel rows are grouped into 24 sections with 8 pixels per section. Each section has an individual output buffer. The block diagram of the 384 by 192 array is shown in FIG. 13. In the center of the array there are 384 columns and 24 groups of TDI sections of 8 pixels each. The signal from each of the 24 TDI sections is buffered by one of the 24 amplifiers formed in a group.

The integrated ASIC chip has its own on-chip clock generators and drivers, and it only needs clock and synchronization signals to work, but it is also designed such that external clock generators and drivers can be used to operate the chip. It has an on-chip bias voltage generator which generates all the bias voltages needed by the chip. However, the bias voltages can be externally supplied if needed.

The integrated ASIC chips are fabricated at a foundary on silicon wafers. On each wafer there are 10 large integrated ASIC chips and 12 small integrated ASIC chips. The fabrication process used was 2 Micron Double Poly, Double Metal CMOS specially developed for manufacturing CCDs. This process was further modified due to the large size of the integrated ASIC chip so that sufficient yield can be obtained.

Figure 14:
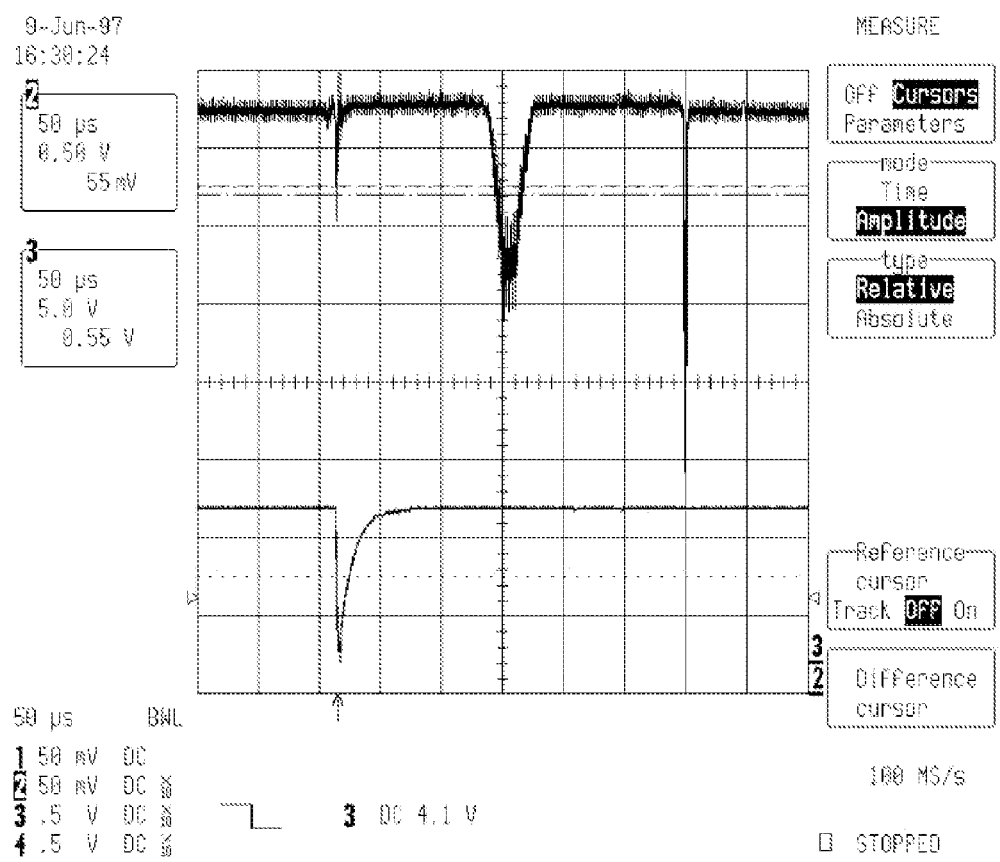
FIG. 14 shows oscilloscope captured image of the output response of a integrated ASIC chip to a light spot of 1 mm diameter.

The integrated ASIC chip wafers were tested using a probe card test station in a clean room. The yield of the chips was above expectations so far. The integrated ASIC chips were also tested with silicon PIN diode arrays mounted on them. FIG. 14 shows the output signal captured on an oscilloscope, from a small integrated ASIC chip. The top trace is the output response of a light spot of about 1 mm in diameter. The noise is somewhat higher because of the present probe station setup. For a carefully packaged integrated ASIC chip the output noise is expected to be below 3,000 electrons.

A major advantage of the high Z pixel detectors such as the CdTe detectors over silicon is their high atomic number and density. High quantum efficiency can be obtained with very thin detectors. This eliminates the problem of resolution loss due to parallax resulting when a flat detector assembly is used with a diverging x-ray beam (fan beam). Also because the detector is electrostatic, the lateral spread of electron-hole (e-h) pairs is limited by the large collection bias of several hundred volts. This offers the potential for achieving higher spatial resolution than that available with phosphor-fiber-optic-CCD type systems. FIG. 14 shows Oscilloscope captured image of the output response of a integrated ASIC chip to a light spot of 1 mm diameter. Bottom trace is the trigger signal and the top trace is the captured light spot output.

PbI$_2$ Pixel Detectors for X-Ray Imaging

PbI$_2$, a wide bandgap semiconductor ($E_g$=2.3 eV), was originally chosen as a promising single crystal detector material for x-ray spectroscopy. However, the small single crystals (<2.5 cm$^2$ at present) are not suitable for large area x-ray imaging applications. A method of preparing polycrystalline lead iodide films has been developed which can principally be scaled to the large areas required for imaging. Thick films (approximately 200 μm) of up to 25 cm$^2$ have been prepared and characterized for their detection properties. Films exhibit high resistivity (5×10$^{12}$ Ω·cm) and good charge transport properties (μτ=10$^6$ cm2/V), hence they operate with a high signal to noise ratio.

Figure 15A:
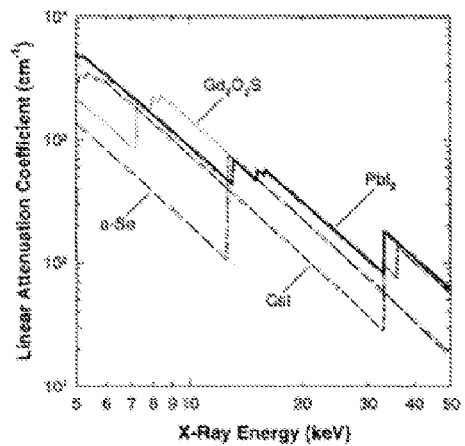
FIG. 15(a) shows linear x-ray attenuation coefficient as a function of energy.
Figure 15B:
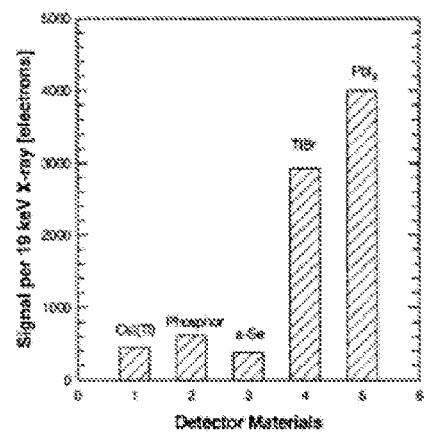
FIG. 15(b) shows gain or conversion efficiency various detector materials.

While PbI$_2$ has not received much attention as yet in diagnostic radiology, its physical and electronic properties make it a very attractive material for x-ray detection. It has high x-ray stopping efficiency due to high Z constituents ($Z^{pb}$=82, $Z_1$=53) and high density (approximately 5.5 g/cm$^3$ for films). FIGS. 15(a) and 15(b) show the variation of the absorption coefficient as a function of x-ray energy for various detector materials such as PbI$_2$, selenium, silicon, and Gd$_2$O$_2$S (the phosphor material in Kodak Min-R™ screens). The stopping efficiency of lead iodide is superior over much of the range of diagnostic energies. A 100 μm thick PbI$_2$ film has 96% stopping efficiency for 19 keV x-rays. The sensitivity of a detector is also dependent on the energy required for charge generation (in direct detection) or for photon generation (in phosphors). The energy to form an electron-hole pair in PbI$_2$ has been measured as 4.8 eV in single crystal to between 5 and 10 eV for films. Thus, the conversion efficiency or gain (number of e-h pairs per x-ray photon) of PbI$_2$ is significantly higher than present in other materials also shown in FIGS. 15(a) and 15(b). The combination of higher x-ray absorption and gain for PbI$_2$ opens possibilities for improved breast diagnosis for current exposure levels, or the current level of diagnostic performance with less dose.

The collection efficiency of charges generated upon x-ray exposure dictates the overall sensitivity and signal to noise ratio. This depends on the drift mobility (μ) and the trapping lifetime (τ) of the charges (both electrons and holes) in the material, and the product of these two quantities (μτ) generally quantifies the drift of charge in response to an applied electric field. A high μτ product is desired, and the μτ product of PbI$_2$ is about ten times higher than that of a-Se, one of the most interesting alternative photoconductor layers. As a result, PbI$_2$ films operate at electric fields ¹/₁₀ the strength needed for a-Se (typically 10-30 V/μm). A high resistivity is also important to minimize dark leakage current and its contribution to electronic noise. Fortunately, the resistivity of PbI$_2$ films is very high (approximately 5×10$^{12}$ Ω·cm) and films generally produce leakage currents of less than 100 pA/mm$^2$. Table I lists physical and electronic parameters of various detector materials available in film form. In the table, $E_{pair}$ is the energy pair required for electron-hole pair creation (in direct detection), while $E_{ph}$ is the energy required for photon creation (in indirect detection).

The data in Table I makes it possible to calculate signal amplitude, dark current noise (for photodetectors), and the signal to dark current noise for the various materials. The order of magnitude higher value of the µτ product, coupled with higher absorption efficiency, results in a superlative S/N for $PbI_2$. Also to be noticed is that the $PbI_2$ S/N begins to plateau at 100 V.

The intrinsic spatial resolution of lead iodide films is expected to be very good due to electrostatic focusing of charges by the applied electric field. As a result, the spatial resolution of a pixellated $PbI_2$ film detector will largely be determined by the pixel size and not by spreading effects such as light scattering, which is noticed in scintillator based detectors.

FIG. 15(a) shows linear x-ray attenuation coefficient as a function of energy. FIG. 15(b) shows gain or conversion efficiency various detector materials.

TABLE II

Detector Properties

| Material | Type | Density [g/cm$^3$] | Atomic Number(s) | Epair or Eph [eV] | Resistivity | µτProduct |
|---|---|---|---|---|---|---|
| $Gd_2O_{2S:Tb}$ | Indirect | 3.2 | 64,8,16 | 31 | NA | NA |
| a-si:h | Direct | 2.3 | 14 | 4. | $1 \times 10^{12}$ | $7 \times 10^{-8}$ |
| a-Se | Direct | 4.3 | 34 | 50 | $1 \times 10^{13}$ | $1.4 \times 10^{-7}$ |
| $PbI_2$ | Direct | 5.5 | 82,53 | 4.8 | $5 \times 10_{12}$-$8 \times 10^{12}$ | $2 \times 10^{-6}$ |
| TlBr | Direct | 7.2 | 81,35 | 6.5 | $1 \times 10^{12}$-$5 \times 10^{10}$ | $3 \times 10^{-6}$ |

Imaging characteristics of lead iodide have been demonstrated in a vidicon-type vacuum tube. In this experiment, lead iodide films (2.5 cm diameter, 100 µm thick) were deposited on an Al substrate and incorporated as the demountable sensor/target on a specially made vidicon tube. The Al substrate was biased to 150 V, while the other face of the $PbI_2$ film was kept close to ground potential by the electron beam in the tube. The resistivity of the lead iodide film was about $8 \times 10^{12}$ Ω·cm as determined from the exceptionally low dark current (2 nA for a 1 cm$^2$ scan). X-ray images of bar phantoms were recorded with a 35 kVp x-ray beam (see FIGS. 16(a) and 16(b)). The spatial resolution exceeded 10 lp/mm and was limited by the tube electron-optics. The contrast transfer function (CTF) of the $PbI_2$ film/imaging tube combination exceeded 50% at 10 lp/mm. Also shown in the figure is the CTF for a standard high resolution $Gd_2O_2S$ screen. This experiment confirmed the expected high spatial resolution achievable with lead iodide films.

Figure 16A:
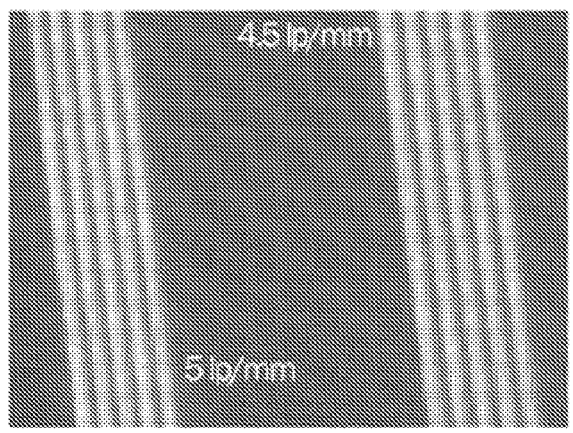
FIGS. 16(a) and 16(b) show imaging properties of lead iodide films in a vidicon tube.
Figure 16B:
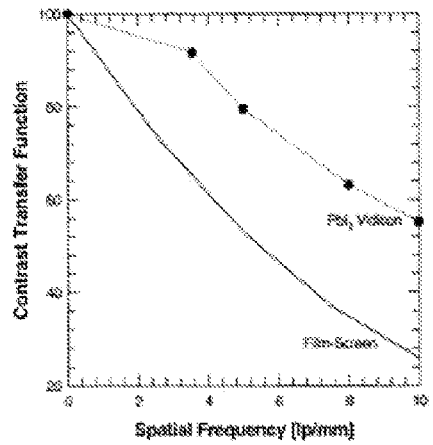

FIGS. 16(a) and 16(b) show imaging properties of lead iodide films in a vidicon tube. FIG. 16(a) shows an x-ray image of a 5 lp/mm bar phantom. FIG. 16(b) shows a plot of CTF versus spatial frequency. The CTF at high spatial frequencies is limited by electron optics. Also shown in FIG. 16(b) is the CTF plot of a high resolution film-screen.

In summary, $PbI_2$ is a very promising detector material for general radiography, industrial radiography and especially digital mammography imaging. It has excellent x-ray stopping power, high gain, and large charge storage capacity. It is vapor depositable to large areas and can be directly applied to a variety of pixellated substrates and sophisticated flip-chip style bonding is not necessary. All that is necessary to complete the detector is that a top electrode be deposited to the top surface. It is an extremely attractive alternative to employing single crystal, or wafer style, detectors such as CdZnTe or GaAs. These design schemes are burdened by the high costs of manufacturing, electrode patterning and bonding of the semiconductor detector. Particular to mammography, the low energy x-rays do not require thick stopping layers, and high spatial resolution is derived directly from the underlying pixel pitch.

Potential for Other Future Applications

The invention also has potential for other radiological applications such as chest x-ray, bone densitometry and other specialized medical radiology which is especially suited for a scanning type system such as the one proposed here. This is because of the higher Z nature of $PbI_2$. Because the $PbI_2$ has such high Z and density, the thickness can be increased by a small amount and pixel detectors with high DQE can be made that will image higher x-ray energies required in other radiology fields.

These detectors can also be used for scanning type industrial imaging applications with ultra high resolution. Nondestructive inspection and evaluation are becoming essential parts in most critical manufacturing processes to achieve the higher quality required for high-tech products and safety-relevant applications such as in inspecting critical aircraft engine parts. Such detectors may also be used for nondestructive inspection of aging aircraft for corrosion and fine fractures.

Se Pixel Detectors for X-Ray Imaging

Similar to the above deposition type detectors amorphous-selenium (a-Se) can also be used to make high Z pixel detectors through direct deposition over the readout chip. Selenium has Z=34. One electron-hole pair production requires about 50 eV energy deposition (at 10 V/µm). This is about 10 times larger then required for CdTe. About 400 micron thick Se can produce approximately 99% quantum efficiency for 25 keV x-rays for mammography. Larger thickness Se pixel detectors can be made for other Hybrid GaAs and Se Pixel Detectors An ideal mammography system where the DQE is >85%, there is limiting resolution ≧10 lp/mm, there is ultra low noise, there is accurate linear response and there is high dynamic range of ≧16,000 (≧14 bits). A mammography system with such specifications can improve early detection of breast cancer by enhancing the precision and x-ray efficiency of image acquisition (performance of the x-ray detector). This can be accomplished by developing wide dynamic range, high spatial resolution high Z hybrid pixel array detectors which efficiently absorb x-rays transmitted by the breast in a mammographic examination and directly and precisely convert their energy to an electronic signal that can be digitized and stored in computer memory as an image matrix. GaAs and Se pixel detectors can be mounted onto the readout ASIC chip using indium bump bonding technique.

New high Z GaAs PIN pixel detector array or an a-Se is hybridized onto an integrated ASIC chip specifically developed for digital mammography to produce prototype hybrid pixel detectors. The preliminary specifications of the these direct conversion digital mammography detectors are given mainly for GaAs pixel detectors as:
1. Pixel detector size: Pixels ≧50×50 micron with 100% fill factor, with each detector module having 128×192 (small size integrated ASIC chip) and 394×192 pixels (large size integrated ASIC chip).

2. Quantum efficiency: 95% to 99% by using adequate thickness of GaAs PIN pixel array or a-Se with 50×50 micron pixels with thin conductive layer formed at the top side for the application of the bias voltage.
3. High modulation transfer function (MTF) and detective quantum efficiency (DQE): A limiting spatial resolution of 10 lp/mm and a DQE of over 85% at zero spatial frequency is anticipated.
4. Dose: Reduction of patient dose by a factor of approximately 6, compared to the film based mammography systems, can potentially be achieved without loss of image quality because of improved detective quantum efficiency (DQE) of these high Z, direct conversion detectors (factor of approximately 2.5) and elimination of the scatter grid (additional factor of approximately 2.5). This will reduce the lifetime dose women receive from periodic mammography screening and make it safer to begin screening at age 40.
5. Dynamic range: Approximately 20,000 (16,384 (14 bits) is used for this example @ 9 Megsamples/s output rate.
6. Number of electron-hole pairs produced per interacting x-ray quantum: Approximately 5,800 and 8,100 electron-hole pairs are detected for a 25 and 35 keV x-ray photons in GaAs, respectively.
7. Linear response and well capacity: Linear throughout the dynamic range with total maximum well capacity of approximately $4\times10^8$ electrons or holes (corresponds to approximately 71,000 incident x-rays per pixel).
8. Readout noise: <20,000 electrons RMS (corresponds to <3 incident x-ray quanta per pixel).
9. Active area: (0.96 cm wide detector active width)×24 cm linear array for scanning up to 30 cm length to cover the full breast.
10. Image size: Approximately 4,800 by 6,000 pixels.
11. TDI channels and Scan time: On chip ≧192 pixel TDI channels and ≦4 s scan time.
12. Operation temperature: Room temperature or slightly below room temperature.
13. Breast tissue coverage: The low profile detector array will help maximize coverage of the breast tissue.

Figure 3E:
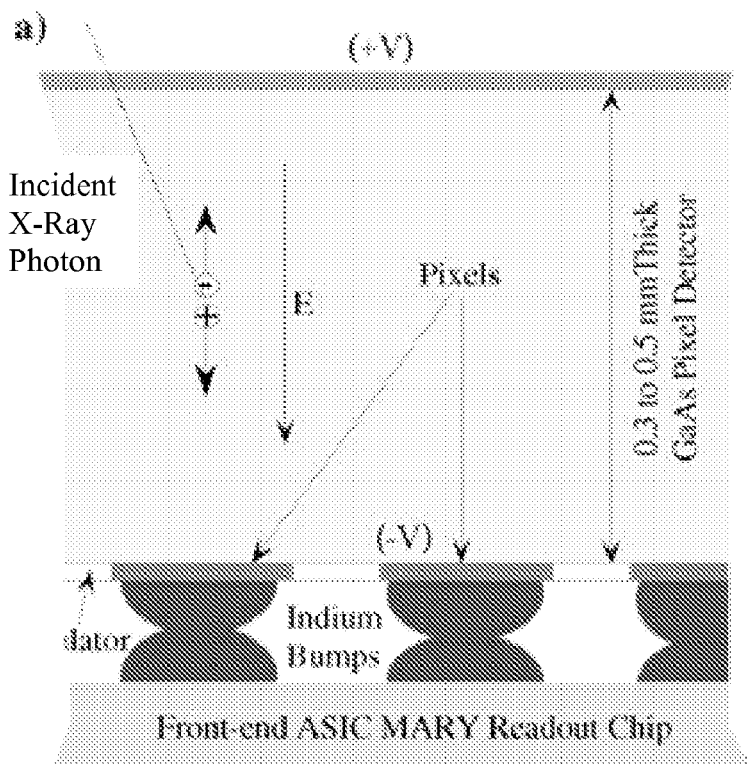
FIG. 3(e) shows a drawing of the GaAs-pixel detector.
Figure 3F:
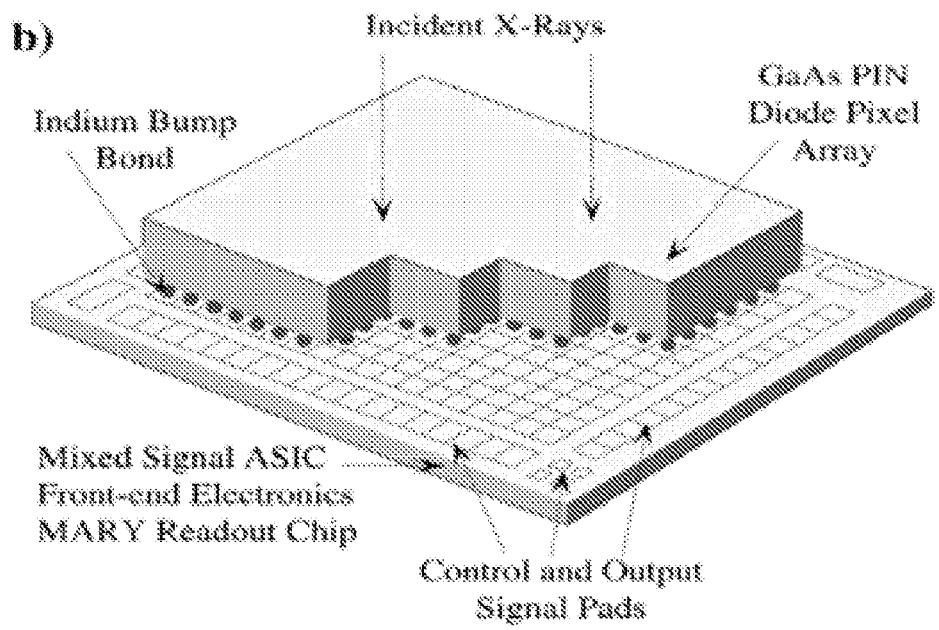
FIG. 3(f) shows a three dimensional drawing of the GaAs detector.
Figure 3G:
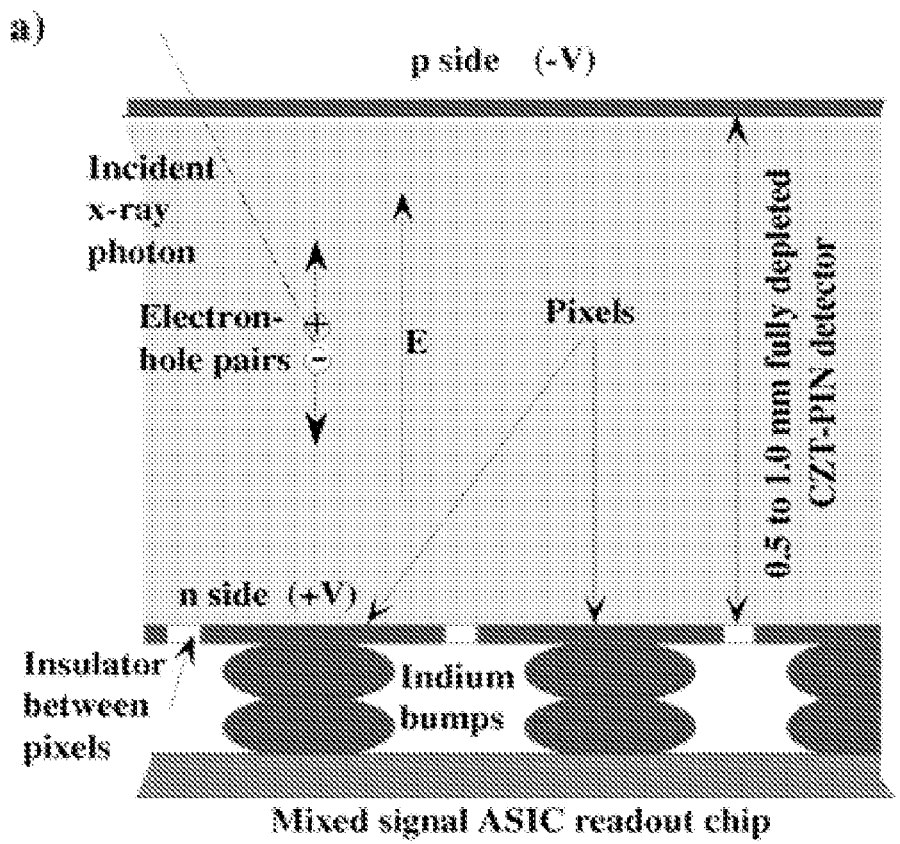
FIG. 3(g) shows a drawing of the CdZnTe detector.
Figure 3H:
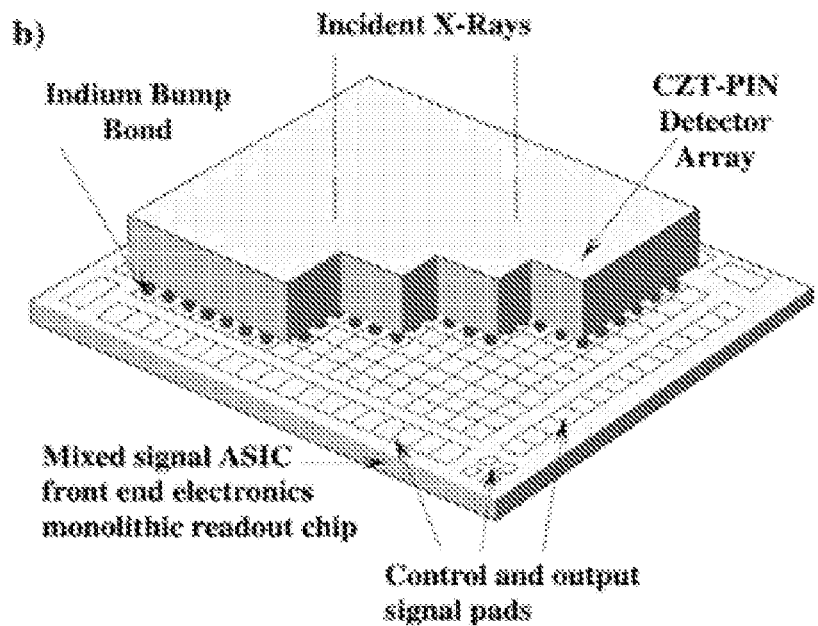
FIG. 3(h) shows a three dimensional drawing of the CdZnTe detector.

The GaAs Pixel detector is shown in FIGS. 3(e) and 3(f). The Se pixel detector is very similar to the GaAs pixel detector. For this application the integrated readout Application Specific Integrated Circuit (ASIC) chip can be used directly. However, Se has lower electron-hole pair yield per incident x-ray photon and will need a slightly modified integrated ASIC chip to allow for the smaller number of electron-hole pairs created.

The integrated ASIC chip works in TDI acquisition mode. In this mode the detector and x-ray source move across the breast while the charge collected in the wells of the CCD readout are transferred down columns of the CCD at the same speed but in the opposite direction, thus providing low noise integration of the detector signal and permitting a long, narrow detector to be used to produce a large area image. A major advantage of this approach is that the x-ray beam is in a slot format providing highly efficient rejection of scattered radiation from the imaging system and provides a potential dose advantage of 2.5 times versus using an anti scatter grid. NOVA silicon pixel detectors will provide improvements beyond the first generation phosphor-fiber-optic-CCD systems. However, with silicon the DQE will be limited (approximately 50%@ approximately 25 keV) due to the low atomic number (Z=14) and low density (2.3 g/cc) of the silicon. Therefore, a relatively high detector thickness of greater than 2 mm is required. The performance of silicon may be improved by using high Z materials such as GaAs (and a-Se) which are denser (5.32 g/cc). Higher Z materials (Z approximately equals 32) bring the DQE very close to an ideal detector, which is about 4 times higher than film-screen systems. The present integrated ASIC is designed to detect holes generated in silicon. Use the same ASIC readout chip can be used for the GaAs and Se pixel detectors. This is a good match as hole mobility is very good in both GaAs and Se.

Figure 17:
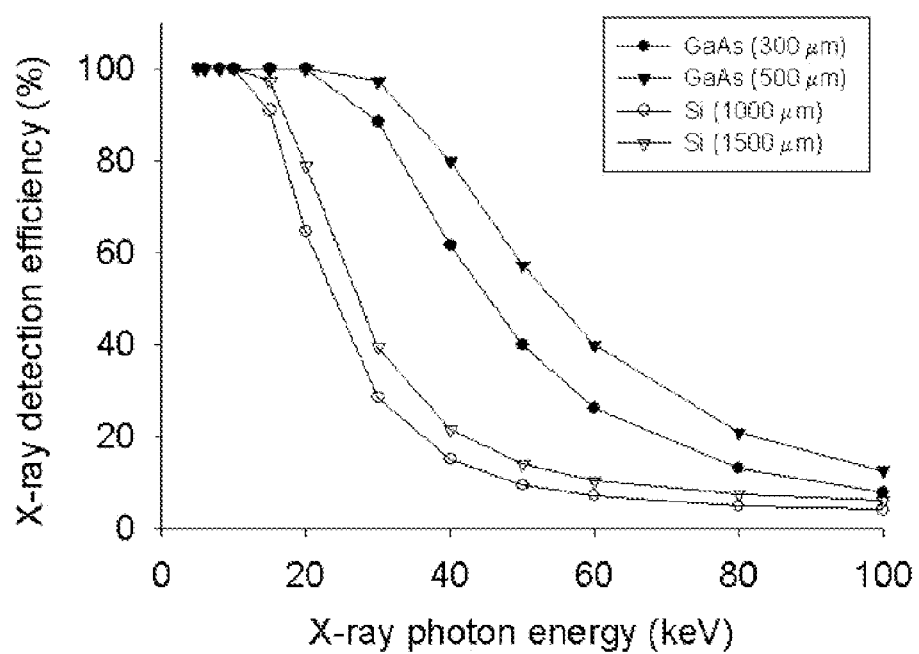
FIG. 17 shows the x-ray linear attenuation coefficients for GaAs, where the thickness of the detector for 99% x-ray absorption is 0.3 mm at 20 keV.

For 15 to 35 keV x-rays used in mammography, the important detection process is almost entirely the photoelectric effect for GaAs. Using the x-ray linear attenuation coefficients for GaAs (FIG. 17), the thickness of the detector for 99% x-ray absorption is 0.3 mm at 20 keV. 0.3 mm GaAs detectors can be used and 0.5 mm detectors may be used to increase the quantum efficiency at higher energies. GaAs detectors with depletion depth nearly equal to its thickness, approximately 0.3 mm thickness or larger are possible. The gain in DQE at 0.3 mm thickness is already a major improvement for digital mammography. 1 mm thick Se detectors are also possible.

The integrated ASIC chip is designed to readout pixel detector arrays with 50 micron pixel size, using an Indium Bump Bonding technique. One small and one large size prototype integrated ASIC chip have been fabricated. The larger chip has the maximum size acceptable for silicon fabrication with sufficient yield. Its size is about 20×13 mm. On each wafer there are 10 large integrated ASIC chips and 12 small integrated ASIC chips. The fabrication process used is 2 Micron Double Poly, Double Metal CMOS specially developed for CCDs. This process is further modified due to the large size of the integrated ASIC chip so that sufficient yield can be obtained.

Several small and large size integrated ASIC chips were hybridized with matching (50×50 micron pixel size) 1 mm thick two-dimensional silicon PIN diode arrays. These detectors were tested and the working detectors were used to obtain preliminary images of test phantoms. One of them showed the Image of the bar pattern in the TDI scan direction, and the other showed the image of the bar pattern in the non TDI or slot direction. The image quality (MTF) was better in the non TDI direction. Theoretically this is expected because the charge transport efficiency is not 100%. Improvement of the charge transport efficiency may reduce this effect by improving the CCD circuit quality by using new optimized CCD processes. The DQE falls rapidly with energy for silicon pixel detectors.

Gallium arsenide (GaAs) PIN pixel detector arrays can be specifically designed for digital mammography. They will be indium bump bonded onto the pixellated integrated ASIC readout chips. GaAs is an attractive detector material for a digital mammography system since its relatively high atomic number (a mean atomic number of 32) produces a significantly higher stopping power for medium energy x-rays compared to a silicon detector of corresponding thickness. For x-rays in the energy range of interest (25 to 35 keV), the photoelectric stopping efficiency of a 300 and a 500 micron thick GaAs PIN photodiode array is between 95%-75% and 98%-90%, respectively, compared to less than 10% for silicon of the same thickness. This greater photon stopping efficiency improves DQE and allows the use of shorter image acquisition times, higher quality images and/or a reduced radiation dose to the patient.

Most recently research has concentrated on the development of new ion implanted detector contacts for semi-insulating GaAs detectors as a more robust alternative to the thermally evaporated Schottky contacts which have been used previously. The motivation for developing such new contacts is to reduce the dark current in the device and to allow reliable over-biased operation. Reduction of dark current is of primary importance for imaging detectors which are using charge integrating readout electronics, such as the integrated ASIC chip. An excessive dark current in such devices tends to reduce the dynamic range of each pixel, increase noise in the captured image, and prevent the use of long integration times. In GaAs photodiodes typical dark current densities at room temperature are of the order of $10^{-8}$ A/mm$^2$ which is slightly higher than that available from silicon PIN pixel arrays.

An ion-implanted contact exhibits a dark current which, in the region of stable operation, is reduced by a factor of three or greater compared to the standard type. The ion-implanted device can also be operated at high bias voltages in excess of 500 V, whereas the Schottky-type device suffers from rapid breakdown at bias voltages under 200 V. This rapid breakdown behavior is typical of Schottky-type GaAs detectors and prevented such devices from operating reliably at high bias.

It is important to operate these detectors in a stable manner at high bias since the thickness of the detector which is sensitive to x-rays increases at an approximately linear rate which is about 0.7 micron thickness per volt of applied bias. Operation of the ion-implanted detector at a bias voltage close to 300 V allows about 210 micron thickness to be fully depleted and sensitive. These results are from the first generation of ion-implanted devices and during this project work is planned to further reduce the measured dark currents, for example by the use of optimized surface passivation treatments, to develop the second generation detectors. Using the ion-implanted detector contact it is possible to obtain a dramatic further reduction in dark current by a modest reduction in temperature of the GaAs wafer.

GaAs detectors are expected to be available with depletion depths reaching 0.3 min. There is reasonable potential that the depletion depth may even reach 0.5 mm at room temperature by applying larger bias voltages. However, if required depletion depth is not obtainable at room temperature it is possible to cool the detectors to modest temperatures such as +10° C. to −10° C. to increase the maximum applicable bias voltage. A staggered linear array of non-overlapping GaAs pixel detectors could incorporate Peltier cooling to reach such temperatures. The present generation of ion-implanted GaAs detectors show dark current densities at temperatures of −10° C. of approximately $10^{-10}$ A/mm$^2$ (or 10 nA/cm$^2$), corresponding to a pixel leakage current of approximately 250 fA for a pixel dimension of 50×50 micron. This is ultra low dark current comparable to the highest quality silicon pixel detectors. Since ion-implanted GaAs PIN diode technology is new, further reduction in dark current is feasible. At present technology level a GaAs pixel detector running at −10° C. has about 0.3 mm depletion depth and will meet the specifications.

FIGS. 3(e) and 3(f) show a preliminary schematic diagram of the GaAs pixel detectors (not to scale). FIG. 3(e) shows the operation principle of the GaAs PIN diode pixel detector array. The e-h pairs created by the photoelectron separates and drifts in opposite directions with respect to the electric field. FIG. 3(f) shows a two-dimensional GaAs diode array is indium bump bonded onto the front end electronics integrated ASIC chip. The pixelized surface is facing the monolithic mixed signal integrated ASIC readout chip with identical pixel size manufactured on silicon.

The invention claimed is:

1. An imaging detector comprising:
 a plurality of detector pixels coupled to a plurality of readout channels, wherein at least one readout channel of said plurality of readout channels receives at least one charge signal from at least one pixel of said plurality of detector pixels, and wherein said at least one readout channel comprises:
 at least one input directly connected to said at least one pixel;
 at least one capacitor connected to said at least one input, wherein said at least one capacitor directly receives and accumulates said at least one charge signal from said at least one input; and
 at least one time delayed integration system connected to said at least one capacitor, wherein said at least one time delayed integration system sums said accumulated at least one charge signal with at least one other accumulated charge signal from at least one pixel of said plurality of detector pixels to produce at least one readout signal.

2. The imaging detector of claim 1, wherein said at least one charge signal is integrated in said at least one readout channel.

3. The imaging detector of claim 1, wherein said accumulated said at least one charge signal is transferred to at least one other said at least one capacitor at least one time before said at least one readout signal is produced.

4. The imaging detector of claim 3, wherein time delayed integration is performed.

5. The imaging detector of claim 1, wherein said plurality of readout channels are divided into at least one group and at least one channel of said at least one group is connected to at least one output.

6. The imaging detector of claim 5, wherein time delayed integration is performed within said at least one group and at least one output of said at least one group is added together with said at least one output of at least one other said at least one group to form an image.

7. The imaging detector of claim 5, wherein each said at least one group uses time delayed integration.

8. The imaging detector of claim 1, wherein said plurality of detector pixels are connected directly to said plurality of readout channels using at least one conductive bump bond.

9. The imaging detector of claim 1, wherein said readout channel is coupled to an adjacent said readout channel in opposite direction to scan direction through a charge transfer circuit.

10. The imaging detector of claim 1, wherein at least one detector material is deposited on top of said readout channels of said imaging detector and said at least one detector material makes electrical contact directly with said readout channels.

11. The imaging detector of claim 1, wherein the side opposite to the side of the detector with plurality of pixels contains a conductive system to supply bias voltage.

12. The imaging detector of claim 1, wherein said at least one charge signal is produced by particles selected from the group consisting of photons, electrons, x-rays and gamma rays.

13. The imaging detector of claim 1, wherein at least one x-ray source is placed at a distance to at least one said imaging detector to produce at least one x-ray beam directed towards said at least one imaging detector.

14. The imaging detector of claim 13, wherein said at least one imaging detector and said at least one x-ray source are moved to scan at least one object placed in between said at least one x-ray source and said at least one imaging detector.

15. The imaging detector of claim 14, wherein said at least one readout channel is coupled to an adjacent said at least one readout channel in the scan direction using a charge coupled device (CCD) circuit.

16. The imaging detector of claim 15, wherein a clock signal transfers said at least one charge signal from at least one readout channel to an adjacent said at least one readout channel which is synchronized to the motion of said imaging detector.

17. The imaging detector of claim 1, wherein said plurality of readout channels and said plurality of detector pixels are made in two dimensions.

18. The imaging detector of claim 17, wherein sizes and dimensions of said plurality of readout channels and said plurality of detector pixels match.

19. The imaging detector of claim 1, wherein said accumulated at least one charge signal is transferred using at least one charge transfer method.

20. An imaging detector array made from a plurality of pixel detectors placed adjacent to each other, wherein each pixel detector comprises:
   a plurality of detector pixels coupled to a plurality of readout channels, wherein at least one readout channel of said plurality of readout channels receives at least one charge signal from at least one pixel of said plurality of detector pixels, and wherein said at least one readout channel comprises:
   at least one input directly connected to said at least one pixel;
   at least one capacitor connected to said at least one input, wherein said at least one capacitor directly receives and accumulates said at least one charge signal; and
   at least one time delayed integration system connected to said at least one capacitor, wherein said at least one time delayed integration system sums said accumulated at least one charge signal with at least one other accumulated charge signal from at least one pixel of said plurality of detector pixels to produce at least one readout signal.

21. The imaging detector array of claim 20, wherein said at least one charge signal is integrated in said at least one readout channel.

22. The imaging detector array of claim 20, wherein said accumulated said at least one charge signal is transferred to at least one other said at least one capacitor at least one time before said at least one readout signal is produced.

23. The imaging detector array of claim 22, wherein time delayed integration is performed.

24. The imaging detector array of claim 20, wherein said plurality of readout channels are divided into groups and a last channel of each group is connected to at least one of said at least one output.

25. The imaging detector array of claim 20, wherein said plurality of pixel detectors are mounted on at least one surface and said at least one surface is selected from the group consisting of flat and curved surfaces.

26. The imaging detector array of claim 20, wherein at least one image of at least one object is produced by placing said at least one object in between at least one said imaging detector array and at least one x-ray source.

27. The imaging detector array of claim 20, wherein at least one said pixel detector placed at an angle to at least one other said pixel detector to form a curved imaging detector array.

28. The imaging detector of claim 20, wherein said at least one charge signal is produced by particles selected from the group consisting of photons, electrons, x-rays and gamma rays.

29. The imaging detector array of claim 20, wherein at least one x-ray source is placed at a distance to at least one said imaging detector array to produce at least one x-ray beam directed towards said at least one imaging detector array.

30. The imaging detector array of claim 29, wherein said at least one imaging detector array and said at least one x-ray source are moved to scan at least one object placed in between said at least one x-ray source and said at least one imaging detector array.

31. The imaging detector array of claim 30, wherein said at least one readout channel is coupled to an adjacent said at least one readout channel in the scan direction using a charge coupled device (CCD) circuit.

32. The imaging detector array of claim 31, wherein a clock signal transfers said at least one charge signal from at least one readout channel to an adjacent said at least one readout channel which is synchronized to the motion of said imaging detector array.

33. A scanning detector system comprising:
   at least one source of a plurality of particles;
   at least one pixel detector positioned to receive and convert said plurality of particles from said at least one source of particles into a plurality of electrical signals, wherein said at least one pixel detector comprises:
   at least one two-dimensional integrated circuit with plurality of inputs;
   at least one input of said plurality of inputs is directly connected to at least one detector pixel of said at least one pixel detector;
   at least one capacitor connected to said at least one input, wherein said at least one capacitor directly receives and accumulates at least one charge signal from said at least one detector pixel;
   at least one time delayed integration system connected to said at least one capacitor, wherein said at least one time delayed integration system sums said accumulated at least one charge signal with at least one other accumulated charge signal from at least one detector pixel of said at least one pixel detector to produce at least one readout signal; and
   at least one processing system that receives said at least one readout signal and produces at least one image.

34. The imaging detector of claim 33, wherein said plurality of particles are selected from the group consisting of photons, electrons, x-rays and gamma rays.

35. An imaging detector comprising:
   at least one integrated circuit with at least one input;
   wherein at least one detector material is deposited on top of said at least one input;
   wherein at least one input receives at least one charge signal from said at least one detector material;
   wherein at least one circuit directly coupled to said at least one input receives and accumulates said at least one charge signal; and
   wherein at least one time delayed integration circuit is connected to at least one capacitor, wherein said at least one time delayed integration circuit sums said accumulated at least one charge signal with at least one other accumulated charge signal from said at least one detector material inside said at least one two-dimensional integrated circuit and produces at least one readout signal.

36. The imaging detector of claim 35, wherein said at least one detector material is selected from the group consisting of Silicon, Selenium, CdTe, CdZnTe, GaAs, $PbI_2$, and $HgI_2$.

37. An imaging detector comprising:
   at least one integrated circuit with a plurality of inputs;
   wherein at least one detector material is bump bonded on top of said plurality of inputs using a plurality of bump bonds;

wherein said at least one detector material makes electrical contact with said plurality of inputs through said plurality of bump bonds;

wherein at least one input of said plurality of inputs receives at least one charge signal from said at least one detector material;

wherein at least one circuit directly coupled to said at least one input receives and accumulates said at least one charge signal; and wherein at least one time delayed integration circuit is connected to at least one capacitor, wherein said at least one time delayed integration circuit sums said accumulated at least one charge signal with at least one other accumulated charge signal from said at least one detector material inside said at least one integrated circuit and produces at least one readout signal.

38. The imaging detector of claim 37, wherein said at least one detector material is selected from the group consisting of Silicon, Selenium, CdTe, CdZnTe, GaAs, $PbI_2$, and $HgI_2$.

39. A method of imaging using a plurality of particles and at least one position sensitive detector, said method comprising:

bump bonding said at least one position sensitive detector on top of at least one integrated circuit with plurality of inputs;

detecting a portion of said plurality of particles by said at least one position sensitive detector and producing a plurality of charge signals;

accumulating said plurality of charge signals on at least one capacitor directly coupled to said plurality of inputs;

connecting a time delayed integration system to said at least one capacitor; and combining at least two of said accumulated plurality of charge signals with one another to produce at least one readout signal.

40. The imaging method of claim 39, wherein said at least one position sensitive detector material is selected from the group consisting of Silicon, Selenium, CdTe, CdZnTe, GaAs, $PbI_2$, and $HgI_2$.

41. The imaging method of claim 39, wherein said at least one position sensitive detector is selected from the group consisting of a pixel detector, a strip detector, a double sided pixel detector, a double sided strip detector, a position sensitive photodiode, a position sensitive avalanche photodiode, an array of photodiodes, and an array of APDs.

42. The method of claim 39, wherein said plurality of particles are selected from the group consisting of photons, electrons, x-rays and gamma rays.

43. A method of imaging using a plurality of particles and at least one detector material comprising:

depositing said at least one detector material on top of at least one integrated circuit with plurality of inputs;

detecting a portion of said plurality of particles by said at least one detector material and producing a plurality of charge signals;

accumulating said plurality of charge signals by on at least one capacitor directly coupled to said plurality of inputs;

connecting a time delayed integration system to said at least one capacitor; and combining at least one of said accumulated plurality of charge signals with at least one other of said accumulated plurality of charge signals to produce at least one readout signal.

44. The imaging method of claim 43, wherein said at least one detector material is selected from the group consisting of Silicon, Selenium, CdTe, CdZnTe, GaAs, $PbI_2$, and $HgI_2$.

45. The method of claim 43, wherein said plurality of particles are selected from the group consisting of photons, electrons, x-rays and gamma rays.

46. A method of imaging using a plurality of particles and at least one position sensitive detector, comprising:

mounting said at least one position sensitive detector on top of at least one integrated circuit with a plurality of inputs;

detecting a portion of said plurality of particles by at least one position sensitive detector that produces a plurality of charge signals;

accumulating said plurality of charge signals directly on at least one capacitor directly coupled to said plurality of inputs;

connecting a time delayed integration system to said at least one capacitor; and combining at least one of said accumulated plurality of charge signals with at least one other of said accumulated plurality of charge signals to produce at least one readout signal.

47. The method of claim 46, wherein said plurality of particles are selected from the group consisting of photons, electrons, x-rays and gamma rays.

48. The imaging method of claim 46, wherein said at least one position sensitive detector is selected from the group consisting of a pixel detector, a strip detector, a double sided pixel detector, a double sided strip detector, a position sensitive photodiode, a position sensitive avalanche photodiode, an array of photodiodes, and an array of APDs.

49. A method of imaging using a plurality of particles and at least one position sensitive detector, comprising:

mounting said at least one position sensitive detector on top of at least one integrated circuit with a plurality of inputs;

detecting a portion of said plurality of particles by at least one position sensitive detector that produces a plurality of charge signals;

accumulating said plurality of charge signals directly on at least one capacitor directly connected to at least one of said plurality of inputs;

transferring said accumulated plurality of charge signals with a charge transfer method that combines at least two of said accumulated plurality of charge signals with one another; and producing at least one readout signal from the combined signal.

50. The method of claim 49, wherein said plurality of particles are selected from the group consisting of photons, electrons, x-rays and gamma rays.

51. The imaging method of claim 49, wherein said at least one position sensitive detector is selected from the group consisting of a pixel detector, a strip detector, a double sided pixel detector, a double sided strip detector, a position sensitive photodiode, a position sensitive avalanche photodiode, an array of photodiodes, and an array of APDs.

52. A method of imaging using a plurality of particles and a plurality of position sensitive detectors, wherein said plurality of position sensitive detectors are made by depositing at least one detector material on top of at least one integrated circuit with plurality of inputs, wherein said method comprising:

placing said plurality of position sensitive detectors adjacent to each other;

positioning at least one source of said particles at a distance to said plurality of position sensitive detectors;

placing at least one object to be imaged in between said at least one source and said plurality of position sensitive detectors;

producing a plurality of charge signals from a portion of said plurality of particles inside said at least one detector material;

accumulating said plurality of charge signals directly on at least one capacitor directly coupled to said plurality of inputs;

connecting a time delayed integration system to said at least one capacitor; and combining at least two of said accumulated plurality of charge signals with one another to produce at least one readout signal.

53. The method of claim 52, wherein said plurality of particles are selected from the group consisting of photons, electrons, x-rays and gamma rays.

54. The method of claim 52, wherein said at least one detector material is selected from the group consisting of Silicon, Selenium, CdTe, CdZnTe, GaAs, $PbI_2$, and $HgI_2$.

55. The method of claim 52, wherein said plurality of position sensitive detectors form a linear array.

56. The method of claim 52, wherein said plurality of position sensitive detectors form a two-dimensional array.

57. The imaging method of claim 52, wherein said at least one position sensitive detector made is formed into a position sensitive detector selected from the group consisting of a pixel detector, a strip detector, a double sided pixel detector, a double sided strip detector, a position sensitive photodiode, a position sensitive avalanche photodiode, an array of photodiodes, and an array of APDs.

* * * * *